US007741771B2

(12) United States Patent
Sugiura et al.

(10) Patent No.: US 7,741,771 B2

(45) Date of Patent: Jun. 22, 2010

(54) LIGHT-EMITTING ELEMENT AND DISPLAY DEVICE AND LIGHTING DEVICE USING SAME

(75) Inventors: Hisanori Sugiura, Hirakata (JP); Tetsuya Satou, Kadoma (JP); Mikiko Matsuo, Nara (JP); Shin-ichiro Hatta, Nara (JP)

(73) Assignee: Panasonic Corporation, Osaka (JP)

(*) Notice: Subject to any disclaimer, the term of this patent is extended or adjusted under 35 U.S.C. 154(b) by 376 days.

(21) Appl. No.: 11/969,869

(22) Filed: Jan. 4, 2008

(65) Prior Publication Data

US 2009/0021137 A1 Jan. 22, 2009

Related U.S. Application Data

(62) Division of application No. 11/086,288, filed on Mar. 23, 2005, now Pat. No. 7,342,246, which is a division of application No. 10/399,855, filed as application No. PCT/JP01/09415 on Oct. 25, 2001, now Pat. No. 6,998,775.

(30) Foreign Application Priority Data

Oct. 25, 2000 (JP) .............................. 2000-325303
May 16, 2001 (JP) .............................. 2001-146912

(51) Int. Cl.
*H01J 1/62* (2006.01)
*H05B 33/00* (2006.01)

(52) U.S. Cl. ........................ 313/498; 313/503; 313/504; 313/512

(58) Field of Classification Search .......... 313/498–512
See application file for complete search history.

(56) References Cited

U.S. PATENT DOCUMENTS

| | | | |
|---|---|---|---|
| 5,929,561 | A | 7/1999 | Kawami et al. |
| 2002/0063117 | A1 | 5/2002 | Church et al. |
| 2004/0008300 | A1 | 1/2004 | Maeda et al. |
| 2004/0079923 | A1 | 4/2004 | Yamazaki et al. |

FOREIGN PATENT DOCUMENTS

| | | |
|---|---|---|
| JP | 59-5595 | 12/1984 |
| JP | 61-195588 | 8/1986 |
| JP | 3-46792 | 2/1991 |
| JP | 4-192290 | 7/1992 |
| JP | 4-306589 | 10/1992 |

(Continued)

OTHER PUBLICATIONS

Garbuzov et al., "High-External-Quantum-Efficiency Organic Light-Emitting Devices," Optics Letters, vol. 22, No. 6, Mar. 15, 1997, p. 396.

(Continued)

*Primary Examiner*—Joseph L Williams
(74) *Attorney, Agent, or Firm*—Steptoe & Johnson LLP

(57) ABSTRACT

A light-emitting element is provided having a layered structure composed of at least a light-emitting layer having a light-emitting region and a reflective layer for reflecting light emitted from the light-emitting region. Light emitted from the light-emitting region is extracted from a light-extracting surface distanced from the light-emitting region. A light-scattering portion is present in a part of the reflective layer.

14 Claims, 23 Drawing Sheets

6
8
d
7
5
3
4
2
1

FOREIGN PATENT DOCUMENTS

| | | |
|---|---|---|
| JP | 05-3079 | 8/1993 |
| JP | 6-151061 | 5/1994 |
| JP | 2773720 | 4/1998 |
| JP | 10-172756 | 6/1998 |
| JP | 10-223367 | 8/1998 |
| JP | 63-314795 | 12/1998 |
| JP | 11-283751 | 10/1999 |
| JP | 2000-077191 | 3/2000 |
| JP | 2000-231985 | 8/2000 |
| JP | 2001-085163 | 3/2001 |
| JP | 2001-202827 | 7/2001 |
| JP | 2001-266768 | 9/2001 |

OTHER PUBLICATIONS

Greenham et al., "Angular Dependence of the Emission from a Conjugated Polymer Light-Emitting Diode: Implications for Efficiency Calculations," Adv. Mater., vol. 6, No. 6, 1994, p. 491.

Sugiura et al., "Double Heterostructure GaAs Tunnel Junction for a AlGaAs/GaAs Tandem Solar Cell," Japanese Journal of Applied Physics, vol. 27, No. 2, Feb. 1988, p. 269.

Tang et al., "Electroluminescence of Doped Organic Thin Films," J. Appl. Phys. vol. 65, No. 9, May 1, 1989, p. 3610.

Tang et al., "Organic Electroluminescent Diodes," Appl. Phys. Lett., vol. 51, No. 12, Sep. 21, 1987, p. 913.

Vincett et al., "Electrical Conduction and Low Voltage Blue Electroluminescence in Vacuum-Deposited Organic Films," Thin Solid Films, vol. 94, 1982, p. 171.

Extraction Efficiency
T
1
0.5
0.35
Examples 14, 23
Examples13, 22
Examples12, 21, 24
Examples6～11, 15～20
Example 5
Example 4
Example 3
Example 2
Example 1
Prior-art example
0.5
>10
d/λ

LIGHT-EMITTING ELEMENT AND DISPLAY DEVICE AND LIGHTING DEVICE USING SAME

TECHNICAL FIELD

The present invention relates to a self luminous light-emitting element, a substrate provided with the light-emitting elements, and a display device and a lighting device that utilize the light-emitting element(s).

BACKGROUND ART

Light-emitting elements that emit light by applying an electric field thereto, such as electroluminescent (EL) elements and light-emitting diodes, are self-luminous, and thus have high visibility and can be made thin. For these reasons, such elements are attracting attention as lighting devices such as backlights and as display devices such as flat panel displays. Above all, organic EL elements that use organic compounds as emitters can be driven at low voltages, can be easily made large in area, and can easily obtain the desired emission color by selecting appropriate dyes, and thus are being actively developed as next-generation displays.

For an EL element using an organic emitter, blue light emission is obtained by, for example, applying a voltage of 30 V to a vapor-deposited anthracene film with a thickness of 1 μm or less (Thin Solid Films, 94 (1982) 171). However, this element did not achieve sufficient luminance even when a high voltage was applied to the element, and thus required further improvement in luminescence efficiency.

On the other hand, Tang et. al. made an element in which a transparent electrode (anode), a hole transport material layer, an electron transport luminescent material layer, and a cathode using a low work function metal were stacked on top of each other, so as to improve luminescence efficiency. The element achieved a luminance of 1000 cd/$m^2$ with an applied voltage of 10 V or less (Appl. Phys. Lett., 51 (1987) 913).

Furthermore, there have been reported an element having a three-layer structure in which a luminescent material layer was sandwiched between a hole transport material layer and an electron transport material layer (Jpn. J. Appl. Phys., 27 (1988) L269), and an element that obtained light emission from a dye doped in a light-emitting layer (J. Appl. Phys., 65 (1989) 3610).

A cross-sectional view of the general configuration of a prior-art organic EL element is shown in FIG. 26. In the drawing, reference numeral 71 denotes a transparent substrate made, for example, of glass, plastic, or the like, reference numeral 72 denotes a transparent anode made, for example, of indium tin oxide (ITO), reference numeral 73 denotes a hole transport material layer made, for example, of N,N'-diphenyl-N,N'-bis(3-methylphenyl)-1,1'-biphenyl-4,4'-diamine (TPD), reference numeral 74 denotes an electron transport luminescent material layer made, for example, of tris(8-quinolinolato)aluminum ($Alq_3$), and reference numeral 75 denotes a cathode made, for example, of an AlLi alloy. Reference numeral 76 denotes a light-emitting layer. When a voltage is applied to the element in the direction shown in the drawing, holes are injected from the anode 72 into the hole transport material layer 73, and electrons are injected from the cathode 75 into the electron transport luminescent material layer 74. The holes injected from the anode 72 pass through the hole transport material layer 73, and then are injected into the electron transport luminescent material layer 74. The holes and electrons are recombined in the electron transport luminescent material layer 74, thereby exciting molecules of $Alq_3$, from which light emission is obtained.

The transparent anode made of ITO is typically formed by sputtering, electron-beam evaporation, or the like. The hole transport material layer and the electron transport luminescent material layer, made of organic substances such as TPD and $Alq_3$, and the cathode made of an AlLi alloy or the like, are typically formed by resistive heating evaporation.

An example of light-emitting elements other than the above-mentioned organic EL element is an inorganic EL element. A cross-sectional view of the general configuration of an inorganic EL element is shown in FIG. 27. In the drawing, reference numeral 81 denotes a transparent substrate made, for example, of glass, reference numeral 82 denotes a transparent electrode made, for example, of ITO, reference numeral 83 denotes a first insulating material layer made, for example, of $Ta_2O_5$, reference numeral 84 denotes a luminescent material layer made, for example, of Mn-doped ZnS, reference numeral 85 denotes a second insulating material layer made, for example, of $Ta_2O_5$, and reference numeral 86 denotes a rear electrode made, for example, of Al. Reference numeral 87 denotes a light-emitting layer. When an alternating electric field is applied to both electrodes of the element, electrons moved from the interfaces between the insulating material layers and the luminescent material layer are accelerated, and thereby collide with and excite Mn, which is the luminescent center. Upon returning to the ground state, light emission occurs.

One of the factors contributing to the limited luminescence efficiency of these light-emitting elements is the external extraction efficiency of light emitted from the light-emitting layer (external extraction efficiency). For example, as shown in FIG. 28, of light emitted from an electron transport luminescent material layer 94 by application of a voltage to an anode 92 and a cathode 95, such light as to have angles equal to or greater than the critical angle is totally reflected at an interface between a hole transport material layer 93 and the transparent electrode 92, at an interface between the transparent electrode 92 and a transparent substrate 91, or at an interface between the transparent substrate 91 and air (i.e., a light-extracting surface), and therefore cannot be extracted outside the element. The external extraction efficiency is expressed by: $1/(2n^2)$, where n is the refractive index of the luminescent material layer (Adv. Mater. 6 (1994) p. 491). In a typical organic EL element, the refractive index of the luminescent material layer is about 1.6 and the external extraction efficiency is about 20%. In an inorganic EL element, when ZnS with a refractive index of about 2.3 is used as the luminescent material layer, the external extraction efficiency is about 10%. Hence, even when the internal quantum efficiency (which is the conversion efficiency of injected electric charges into light) is 100%, because of the limitation by external extraction efficiency, the external quantum efficiency turns out to be on the order of 10% to 20%.

Various methods have been investigated to improve external extraction efficiency. For example, there have been suggested: (1) a method of forming light reflective films at the edges of the substrate (see Japanese Unexamined Patent Publication No. 61-195588 and the like); (2) a method that uses a substrate having light condensing characteristics of lens or the like (see Japanese Examined Patent Publication No. 2670572, Japanese Unexamined Patent Publication No. 4-192290, U.S. Pat. No. 2,773,720, Japanese Unexamined Patent Publication No. 10-172756, Japanese Unexamined Patent Publication No. 10-223367, and the like); and (3) a method in which a light-emitting layer or substrate is formed in a mesa form (see Japanese Unexamined Patent Publication No. 4-306589, Opt. Lett. vol. 27, No. 6 (1997) p. 396, and the like).

The above-mentioned method (1) is such that light reflective films are provided at the edges of the substrate, whereby light, which is propagated mainly through the substrate and then diffracted from the edges of the substrate, is condensed onto a light-extracting surface. However, in the case, for example, of a so-called dot matrix display in which very small light-emitting elements are arranged in a matrix, it is very difficult to form such reflective films on every light-emitting element which corresponds to a unit pixel.

In the case of the above-mentioned method (2) in which the light extraction side of a substrate has a lens configuration, even when light-emitting elements and lenses are disposed at a one-to-one ratio in a dot matrix display such as one described above, because light emitted from a very small single light-emitting element is isotropically emitted, most of the light, which has passed through the substrate with a certain thickness and reached the light extraction side, is incident on the lens on the adjacent pixel side. Accordingly, the effect on the improvement of the efficiency of the light-emitting element, which is the object, is little, and besides, the problem of image blur occurs. In order to overcome the problem, there has been suggested a method of positioning light-emitting regions and lenses as close as possible to each other by, for example, implanting lenses in the substrate (Japanese Unexamined Patent Publication No. 10-172756). This method inhibits such image blur as to be described above and the like, but has difficulty in manufacturing.

The above-mentioned method (3) has difficulty in processing a substrate.

DISCLOSURE OF THE INVENTION

In view of the foregoing and other problems, it is an object of the present invention to provide a light-emitting element that can be fabricated easily and has high external light extraction efficiency. It is another object of the present invention to provide a substrate provided with light-emitting elements in which image blur due to leaked light is minimized. It is still another object of the present invention to provide a display device and a lighting device that use such a light-emitting element(s) and such a substrate provided with light-emitting elements.

The present inventors have conducted a concentrated investigation to attain the above objects, and consequently have found that it is possible to extract light, which would conventionally be confined within a light-emitting layer, a transparent electrode, or a transparent substrate and could not be extracted outside the element, by: positioning, by focusing attention on the thickness of the layers within which light is confined a light-emitting region of a light-emitting layer and a light-extracting surface close to each other such that total reflection does not occur and providing a layer with a refractive index of approximately 1 (first aspect); providing a light-scattering portion to change the incident angle of light on the light-extracting surface (second aspect); providing a light-scattering portion and examining geometrical optics ray paths (third aspect); combining the construction of the first aspect and a part of the construction of the second aspect (fourth aspect); or combining the construction of the first aspect and the construction of the third aspect (fifth aspect). Thereby, the external extraction efficiency is improved, attaining high luminescence efficiency. In addition, provision of a high-grade display device and a high-grade lighting device was made possible.

Light-Emitting Element (First Aspect)

According to a first aspect of the present invention, there is provided a light-emitting element having a layered structure, the layered structure comprising at least a light-emitting layer having a light-emitting region, the light-emitting element comprising, a layer with a refractive index of approximately 1, wherein a distance between a surface of the light-emitting region facing a side of the layer with a refractive index of approximately 1 and a surface of the later with a refractive index of approximately 1 facing a side of the light-emitting region, is limited to 50% or less of a peak wavelength of light.

With the above construction, because the distance between the surface of the light-emitting region facing the side of the layer with a refractive index of approximately 1 and the surface of the layer with a refractive index of approximately 1 facing the side of the light-emitting region is very small, Snell's law or the like is not applicable. Accordingly, it becomes possible to extract light that was confined within the light-emitting element due to total reflection and could not be extracted outside the element. This improves external extraction efficiency, making it possible to provide a light-emitting element with high luminescence efficiency. In such a light-emitting element, by focusing attention on the thickness of individual layers, the individual layers can be made thin so that the light-emitting region and the light-extracting surface are close to each other, and thus fabrication is easy. In addition, in this light-emitting element, because the individual layers are very thin, the element contributes to a reduction in thickness of a display device or lighting device.

As used herein, the term "light-emitting region" refers to a region where light emission actually occurs by application of a voltage. When the distance between the surface of the light-emitting region facing the side of the layer with a refractive index of approximately 1 and the surface of the layer with a refractive index of approximately 1 facing the side of the light-emitting region, is equal to or smaller than a particular distance (optical distance), light emitted therefrom does not apply to Snell's law or the like, and consequently it becomes possible to extract light that conventionally could not be extracted. The reason for providing a layer with a refractive index of approximately 1 is as follows. When a passivation layer, which will be described later, is formed directly on a transparent electrode layer (a second electrode layer, as will be described later), the distance between the light-emitting region and the outside the element becomes large, increasing the amount of light to be totally reflected. On the other hand, when a layer with a refractive index of approximately 1, which has substantially the same refractive index as air (refractive index: 1), is interposed between the passivation layer and the transparent electrode layer, the above-described drawback can be overcome.

In addition, on a substrate, a light reflective first electrode layer, the light-emitting layer, a transparent second electrode layer, and the layer with a refractive index of approximately 1 may be provided in this order.

Even with a light-emitting element having, on the substrate, the reflective electrode, light-emitting layer, and transparent electrode stacked on top of each other in this order, as with the above construction, the external extraction efficiency is increased, as is the case above. In addition, since light is extracted from the opposite side from the substrate, light cannot be propagated through the thick substrate.

Further, a passivation layer may be formed on the layer with a refractive index of approximately 1.

When a passivation layer is thus formed on the layer with a refractive index of approximately 1, while a reduction in external extraction efficiency is prevented, the light-emitting element is sufficiently protected, resulting in an increase in mechanical strength.

On a substrate, a reflective layer, a first transparent electrode layer, the light-emitting layer, a second transparent electrode layer, and the later with a refractive index of approximately 1 may be provided in this order.

Furthermore, a passivation layer may be formed on the layer with a refractive index of approximately 1.

The distance between a surface of the light-emitting region facing a side of the layer with a refractive index of approximately 1 and a surface of the layer with a refractive index of approximately 1 facing a side of the light-emitting region, may be limited to 30% or less, and preferably 20% or less, and particularly preferably 10% or less of the peak wavelength of light.

With such a construction, the external extraction efficiency is further increased.

A distance t between a reflective layer and an interface may be limited to 500 μm or less.

With such a construction, as is the case described above, the external extraction efficiency is increased. In addition, since light is extracted from the opposite side from the substrate, light cannot be propagated through the thick substrate.

In the case of extracting light from the substrate side, when the construction is such that a layer with a refractive index of approximately 1, an underlying layer made of $SiO_2$, a transparent first electrode layer, a light-emitting layer having a light-emitting region, and a second electrode layer serving as a reflective electrode are provided on a substrate, the distance between a surface of the light-emitting region facing the side of the layer with a refractive index of approximately 1 and a surface of the layer with a refractive index of approximately 1 facing the side of the light-emitting region becomes larger due to the presence of the underlying layer made of $SiO_2$, and thus such a structure is not desirable.

An example of the layer with a refractive index of approximately 1 includes an aerogel layer. The same applies to the following aspects.

(Second Aspect)

The present aspect attempts to improve external extraction efficiency by providing a light-scattering portion to change the incident angle of light on the light-extracting surface, and to inhibit, in terms of geometrical optics, image blur and the like caused by leaked light. A more detailed description is given below.

According to a second aspect of the present invention, there is provided a light-emitting element having a layered structure, the layered structure comprising: a light-emitting layer; a light-extracting surface for extracting light emitted from the light-emitting layer; a reflective layer for reflecting light emitted from the light-emitting layer, the reflective layer being provided opposite the light-emitting layer; an interface at which a refractive index decreases in a direction of extracting light from the light-emitting layer; and a light-scattering portion provided at least on a surface of the reflective layer, on a portion in contact with the interface, or between the reflective layer and the light-emitting layer, the light-emitting element wherein, the following Equation (1) is satisfied:

$$t<(n \cos \theta/2)\times L \quad (1),$$

where t is a distance between the reflective layer and the interface, L is a longest distance between any two points in an in-plane direction of the light-emitting element, θ is a critical angle for the interface, and n is a refractive index of the light-emitting layer.

Light emitted from the light-emitting region is isotropically emitted, and then either, depending on the incident angle of the light on the light-extracting surface, extracted outside the element or reflected off the light-extracting surface and confined within the element. That is, light with an incident angle less than the critical angle is extracted outside the element, while light at the critical angle or greater is totally reflected and confined within the element. A light-emitting element having the above construction, however, has a light-scattering portion within the element, and thus the confined light can be scattered within the element, making it possible to change the incident angle of the light on the light-extracting surface. Accordingly, since light having an incident angle less than the critical angle can be extracted outside the element, the external extraction efficiency is increased as compared to prior-art elements.

In addition, with a substrate provided with light-emitting elements that satisfy the above Equation (1), most of the light emitted from a light-emitting region of a single light-emitting element is extracted outside the element from a light-extracting surface of the single light-emitting element, and thus it is possible to inhibit the light from being extracted from a light-extracting surface of another light-emitting element adjacent to the single light-emitting element. As a result, it is possible to provide a display device and a lighting device, in which image blur and the like caused by leaked light are inhibited.

In the above light-emitting element, the light-scattering portion may correspond to an irregular surface of the reflective layer. The light-scattering portion may correspond to an irregular surface of a light reflective first electrode layer. The light-scattering portion may correspond to an irregular surface of an insulating and reflective layer. In addition, in the above light-emitting element, the light-scattering portion may correspond to an irregular surface of the light-extracting surface. When the light-scattering portion has an irregular surface, as is described above, light can be scattered easily. The maximum value ($R_{max}$) of surface roughness of the irregular surface is desirably ¼ or more of the peak wavelength of light. On the irregular surface, a planarizing layer for planarizing the irregular surface may be provided. The planarizing layer may be made of a polymer. In addition, the planarizing layer may be made of a conductive polymer.

Furthermore, the light-scattering portion may be made of a base material and an additive to be dispersed in the base material, and the base material and the additive may have different refractive indices. The dispersion may be performed uniformly or non-uniformly. A transparent second electrode layer may also serve as the light-scattering portion, the transparent second electrode layer including an additive dispersed in ITO, the ITO being a base material, the additive being one selected from the group consisting of inorganic particles and metal particles. Moreover, a light-scattering layer may be additionally formed, which may include an additive dispersed in a polymer, the polymer being a base material, the additive being one selected from the group consisting of inorganic particles and metal particles.

The light-scattering portion may be provided on a surface of the reflective layer, on a portion in contact with the interface, or between the reflective layer and the light-emitting layer.

A layer with a refractive index of approximately 1 may be formed on a film at the interface. In this case, an exposed surface of the layer with a refractive index of approximately 1 may serve as the light-extracting surface. Further, a passivation layer may be formed on the layer with a refractive index of approximately 1. In this case, an exposed surface of the passivation layer may serve as the light-extracting surface.

There may be no additional layer on a film at the interface, and the interface may serve as the light-extracting surface.

(Third Aspect)

The present aspect attempts to further improve mainly the external extraction efficiency by providing a light-scattering portion in a part of the reflective layer. A more detailed description is given below.

There is provided a light-emitting element having a layered structure, the layered structure comprising at least a light-emitting layer having a light-emitting region and a reflective layer for reflecting light emitted from the light-emitting region, the light-emitting element extracting light from a light-extracting surface distanced from the light-emitting region, the light being emitted from the light-emitting region, wherein a light-scattering portion is present in a part of the reflective layer.

Light emitted from the light-emitting region is isotropically emitted, and then either, depending on the incident angle of the light on the light-extracting surface, extracted outside the element or reflected off the light-extracting surface and confined within the element. That is, light with an incident angle less than the critical angle is extracted outside the element, while light at the critical angle or greater is totally reflected and confined within the element. A light-emitting element having the above construction, however, has a light-scattering portion within the element, and thus the confined light can be scattered within the element, making it possible to change the incident angle of the light on the light-extracting surface. Accordingly, since light having an incident angle less than the critical angle can be extracted outside the element, the external extraction efficiency is increased as compared to prior-art elements.

The layered structure may comprise at least the light-emitting layer and a first electrode layer for reflecting light emitted from the light-emitting region, and the reflective layer may be composed of the first electrode layer.

A non-light emitting surface may be present in a part of the first electrode layer, and the light-scattering portion may be provided on the non-light emitting surface.

When the reflective layer is made in a form of an island or lattice, the relative area of the electrode layer is reduced accordingly, making it possible to reduce power consumption.

The form of an island is particularly desirable.

This is because when the reflective layer is in the form of an island, it becomes possible to effectively extract light emitted from the light-emitting region that corresponds to such a form. Specifically, in a light-emitting element having a reflective layer formed in all in-plane directions, it is possible, for example, that light may be extracted from a light-extracting surface of an adjacent light-emitting element. On the other hand, when the reflective layer is in the form of an islands more light can be extracted from a targeted light-extracting surface, and therefore the external extraction efficiency of the targeted light-extracting surface is improved. In addition, since the light-scattering portion is present on the same plane as the reflective layer in the form of an island, the element can be made thin.

When the reflective layer is in the form of an island, there may be a plurality of the reflective layers in the form of an island.

When there is an interface, at which a refractive index decreases in a direction from the light-emitting layer to the light-extracting surface, between the light-emitting layer and the light-extracting surface, the following Equation (1) may be satisfied:

$$t<(n\cos\theta/2)\times L \quad (1),$$

where t is a distance between the reflective layer and the interface, L is a longest distance between any two points in an in-plane direction of the light-emitting element, θ is a critical angle for the interface, and n is a refractive index of the light-emitting layer.

With such a construction, image blur and the like caused by leaked light can be inhibited, as is the case described above.

In the above light-emitting element, the light-scattering portion may correspond to an irregular surface of the reflective layer. In addition, the light-scattering portion may correspond to an irregular surface of the light reflective first electrode layer. The light-scattering portion may correspond to an irregular surface of an insulating and reflective layer. Moreover, in the above light-emitting element, the light-scattering portion may correspond to an irregular surface of the light-extracting surface. When the light-scattering portion has an irregular surface, as is described above, light can be scattered easily. The maximum value ($R_{max}$) of surface roughness of the irregular surface is desirably ¼ or more of the peak wavelength of light. On the irregular surface, a planarizing layer for planarizing the irregular surface may be provided. The planarizing layer may be made of a polymer. In addition, the planarizing layer may be made of a conductive polymer.

(Fourth Aspect)

The present aspect attempts to further improve mainly the external extraction efficiency by combining the construction of the first aspect and a part of the construction of the second aspect. A more detailed description is given below.

There is provided a light-emitting element having a layered structure, the layered structure comprising at least a light-emitting layer having a light-emitting region, the light-emitting element extracting light from a light-extracting surface distanced from the light-emitting region, the light being emitted from the light-emitting region, the light-emitting element comprising: a layer with a refractive index of approximately 1; and a light-scattering portion, wherein a distance between a surface of the light-emitting region facing a side of the layer with a refractive index of approximately 1 and a surface of the layer with a refractive index of approximately 1 facing a side of the light-emitting region, is limited to 50% or less of a peak wavelength of light.

With this construction, most of the light emitted from the light-emitting region is extracted outside the element without being reflected. Even if the light is reflected, the incident angle of the light on the light-extracting surface becomes less than the critical angle due to the presence of the light-scattering portion, and thus the light is extracted outside the element, further increasing external extraction efficiency.

It is to be noted, however, that a layer with a refraction index of approximately 1 is not essential. Even without the layer with a refraction index of approximately 1, similar function and effect to those described above can be obtained. In such a case, the distance between the surface of the light-emitting region facing a side of the light-extracting surface and the light-extracting surface may be limited to 50% or less of the peak wavelength of light.

In the present aspect, modifications may be made in such a manner as to be made to the constructions of the first and second aspects.

(Fifth Aspect)

The present aspect attempts to further improve mainly the external extraction efficiency by combining the construction of the first aspect and the construction of the third aspect. A more detailed description is given below.

There is provided a light-emitting element having a layered structure, the layered structure comprising at least a light-emitting layer having a light-emitting region, the light-emitting element extracting light from a light-extracting surface (distanced from the light-emitting region, the light being emitted from the light-emitting region, the light-emitting element comprising, a layer with a refractive index of approximately 1, wherein: a distance between a surface of the light-emitting region facing a side of the layer with a refractive index of approximately 1 and a surface of the layer with a refractive index of approximately 1 facing a side of the light-emitting region, is limited to 50% or less of a peak wavelength of light; and the layered structure includes a reflective layer for reflecting light emitted from the light-emitting region, a light-scattering portion being present in a part of the reflective layer.

With this construction, most of the light emitted from the light-emitting region is extracted outside the element without being reflected. Even if the light is reflected, the incident angle of the light on the light-extracting surface becomes less than the critical angle due to the presence of the light-scattering portion, and thus the light is extracted outside the element, further increasing external extraction efficiency.

It is to be noted, however, that a layer with a refraction index of approximately 1 is not essential. Even without the layer with a refraction index of approximately 1, similar function and effect to those described above can be obtained. In such a case, the distance between the surface of the light-emitting region facing a side of the light-extracting surface and the light-extracting surface may be limited to 50% or less of the peak wavelength of light.

In the present aspect, modifications may be made in such a manner as to be made to the construction of the first aspect and a part of the construction of the third aspect.

Display Device

A display device of the present invention may utilize any one of the light-emitting elements described in the first to fifth aspects.

Lighting Device

A lighting device of the present invention may utilize any one of the light-emitting elements described in the first to fifth aspects.

BRIEF DESCRIPTION OF THE DRAWINGS

FIG. 9(*a*) is a cross-sectional view of the light-emitting element and FIG. 9(*b*) is a plan view showing a surface where a reflective electrode and a light-scattering layer are present.

FIG. 10(*a*) is a cross-sectional view of the light-emitting element and FIG. 10(*b*) is a plan view showing a surface where reflective electrodes and a light-scattering layer are present.

BEST MODE FOR CARRYING OUT THE INVENTION

The embodiments of the present invention are described below with reference to the drawings.

Embodiment 1

Figure 1:
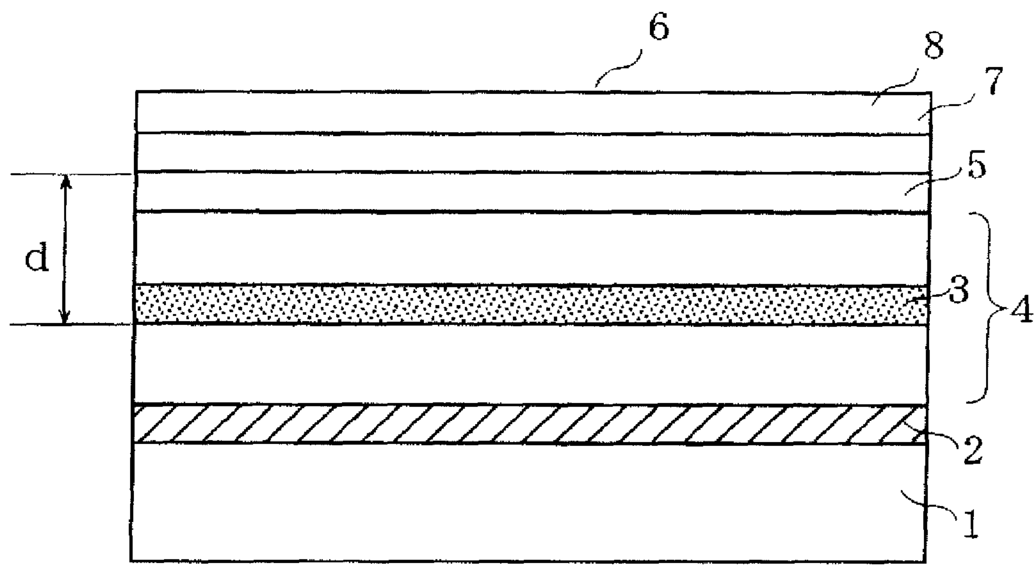
FIG. 1 is a cross-sectional view schematically showing a light-emitting element according to Embodiment 1 of the present invention.

FIG. 1 is a cross-sectional view schematically showing a light-emitting element according to Embodiment 1, which corresponds to the foregoing first aspect. The light-emitting element is constructed such that on a substrate 1 a reflective electrode 2 (a light-reflective first electrode layer), a light-emitting layer 4 having a light-emitting region 3 (specifically, the light-emitting layer comprises an electron-injecting layer, an electron transport luminescent material layer, a hole transport material layer, a buffer layer, and the like), a transparent electrode 5 (a transparent second electrode layer), an aerogel layer 7 with a refractive index of approximately 1, and a passivation layer 8 are stacked on top of each other in this order. A surface of the passivation layer 8 serves as a light-extracting surface 6.

For the substrate 1, any type of substrate can be used as long as it can support the light-emitting element. It is possible to use a resin substrate made, for example, of polycarbonate, polymethyl methacrylate, or polyethylene terephthalate, a silicon substrate, or the like, in addition to a glass substrate.

The reflective electrode 2 should have high reflectivity and an electrode function that allows the light-emitting layer 4 to efficiently emit light. It is therefore desirable to use a metal film made of Al or an Al compound, silver or a silver compound, or the like. For the silver compound, an alloy of silver, palladium, and copper (AgPdCu) or an alloy of silver, gold, and copper (AgAuCu) is desirably used. In the case of a so-called current injection type organic EL element using an organic compound for the luminescent material layer, the reflective electrode normally serves as a cathode or anode. For the cathode, a material with good electron-injection efficiency, i.e., a material with a low work function, is often used. For the anode, a material with good hole injection efficiency, i.e., a material with a high work function or high ionization potential, is often used. For the cathode of an organic EL element, for example, an alloy of a metal with a low work function and high reactivity (Li, Mg, or the like) and a metal with low reactivity and good stability (Al, Ag, or the like), such as an AlLi alloy or an MgAg alloy, can be used. Alternatively, it is also possible to use a layered electrode made of a metal with a low work function or a compound thereof and a metal with a high work function, such as Li/Al or LiF/Al. In forming the reflective electrode, sputtering, electron-beam evaporation, resistive heating evaporation, and the like can be employed.

In the case of an organic EL element, the light-emitting region 3 of the light-emitting layer 4 is made of an organic compound such as $Alq_3$. The light-emitting layer 4 may have a single layer structure or a multilayer structure in which layers are divided by function. In the case of the multilayer structure, as is the case with prior-art structures, it is possible to employ, for example, a two-layer structure consisting of a hole transport material layer using TPD or the like and an electron transport luminescent material layer using $Alq_3$ or the like, a three-layer structure consisting of a hole transport material layer using TPD or the like, a luminescent material layer using perylene or the like, and an electron transport material layer using oxadiazole or the like, or a multilayer structure consisting of more than three layers. It is to be noted that the hole transport material layer is disposed on the hole-injecting electrode side such as ITO, and the electron transport material layer is disposed on the electron-injecting electrode side such as AlLi or MgAg. In the case of an organic EL element, the light-emitting layer is formed mostly by resistive heating evaporation; however, it is also possible to employ electron-beam evaporation, sputtering, and the like.

In the case of an inorganic EL element, as is the case with prior-art structures, for example, a structure is employed in which a luminescent material layer, which is made of ZnS or the like doped with Mn or the like, is sandwiched between insulating material layers made of $Ta_2O_5$ or the like. These layers are mostly formed by sputtering, but it is also possible to employ electron-beam evaporation, resistive heating evaporation, ion plating, and the like.

For the transparent electrode 5, normally, one with a light transmittance of more than 50% is used. For example, it is possible to use a transparent electrode of oxide such as indium tin oxide (ITO) or tin oxide or a metal thin film electrode with a thickness of the order of 5 nm to several tens of nm. The transparent electrode can be formed by sputtering, resistive heating evaporation, electron-beam evaporation, ion plating, and the like.

In the case of an organic EL element, when the substrate having formed thereon a light-emitting layer, is heated to high temperatures, the light-emitting layer is degraded, and therefore a transparent electrode needs to be deposited at low temperatures. Further, in cases where an ITO film or the like, serving as a transparent electrode, is formed by sputtering, electron-beam evaporation, or the like, it is desirable to form a buffer layer between the light-emitting layer and the transparent electrode so as to reduce damage to the light-emitting layer. For the buffer layer, a thermally stable organic compound such as copper phthalocyanine is suitably used. It is to be noted that when, for example, a transparent metal thin film, such as MgAg, with a film thickness of the order of 10 nm is used, damage to the light-emitting layer can be reduced, and thus it is not necessary to provide a buffer layer.

The aerogel layer 7 was prepared as follows. A solution, in which methyl silicate, methanol, water, and ammonia were mixed, was spin coated onto the transparent electrode 5 in air saturated with methanol vapor, and then was placed in air saturated with methanol vapor for a given time, thereby forming a wetting gel. Next, the microskeleton of silica contained in this wetting gel thin film was hydrophobized with hexamethyldisilazane, and then the solution included in the wetting gel thin film was extracted and removed with carbonic acid gas with 80° C. and 16 Mp, thereby preparing a hydrophobic silica aerogel thin film (aerogel layer).

The passivation layer 8 was prepared by forming $SiO_2$ on the aerogel layer 7 by EB evaporation or sputtering.

Here, when the distance d between the surface of the light-emitting region 3 facing the side of the aerogel layer 7 and the surface of the aerogel layer 7 facing the side of the light-emitting region 3, is limited to 50% or less of the peak wavelength of light, most of the emitted light is extracted outside the element without being reflected. Accordingly, the light-emitting element turns out to have higher external extraction efficiency and higher luminescence efficiency than prior-art light-emitting elements. In particular, the distance d between the surface of the light-emitting region 3 facing the side of the aerogel layer 7 and the surface of the aerogel layer 7 facing the side of the light-emitting region 3 is preferably 30% or less, and more preferably 20% or less, and most preferably 10% or less of the peak wavelength of light.

Now, the principle of improvement of external extraction efficiency of the present embodiment is described. A prior-art element comprises, from the transparent substrate side, an anode electrode (transparent electrode)/light-emitting layer/cathode electrode (reflective electrode). Light emitted from a light-emitting region of the light-emitting layer is transmitted through the transparent electrode and the transparent substrate, and then extracted from the transparent substrate side. The light emitted from the light-emitting region is refracted, when transmitted through the transparent electrode and the like, at interfaces according to Snell's law. Then, at an interface between a light-extracting surface, i.e., the transparent substrate, and air, light at the critical angle or greater is totally reflected and confined within the transparent substrate, light-emitting layer, or transparent electrode. In the case, for example, of an organic EL element, when the refractive index of the light-emitting layer is 1.6, of light produced in the light-emitting layer, only such light as to have a solid angle of up to 39° can be extracted outside the element. On the other hand, an element of the present embodiment comprises, from the substrate side, a cathode electrode (reflective electrode)/organic light-emitting layer/anode electrode (transparent electrode). Light emitted from a light-emitting region of the light-emitting layer is extracted after having been transmitted through the transparent electrode or after having been reflected off the reflective electrode. In this case, when the distance d between the surface of the light-emitting region facing the aerogel layer side and the surface of the aerogel layer facing the light-emitting region side is 50% or less of the peak wavelength of light, Snell's law or the like is not applicable because the optical path length is very short. Consequently, most of the light at the critical angle or greater can be extracted outside the element without being reflected off the light-extracting surface.

Embodiment 2

Figure 2:
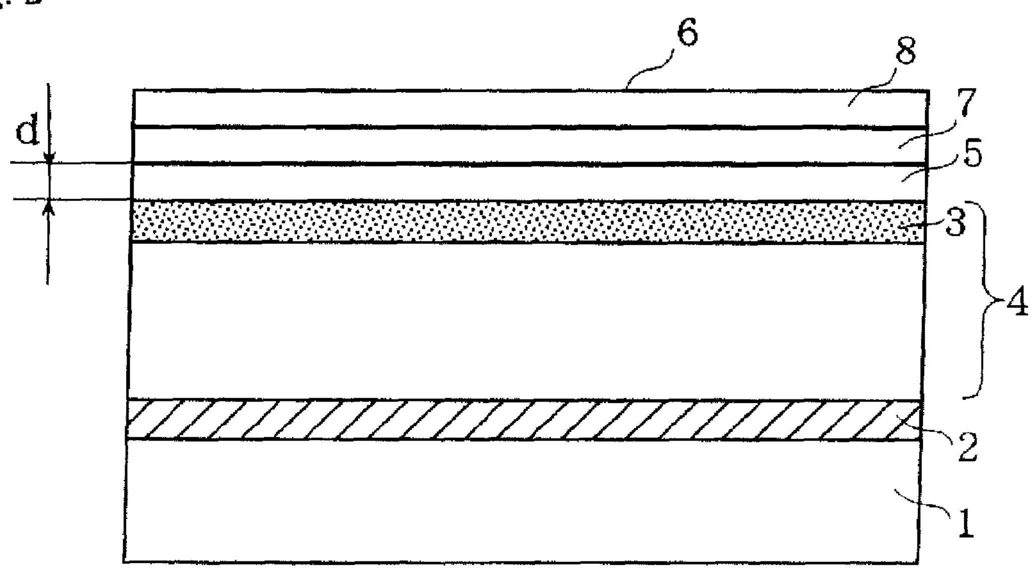
FIG. 2 is a cross-sectional view schematically showing a light-emitting element according to Embodiment 2 of the present invention.

FIG. 2 is a cross-sectional view schematically showing a light-emitting element according to Embodiment 2, which corresponds to the foregoing first aspect. In the light-emitting element, a light-emitting region 3 exists in contact with a transparent electrode 5. In an element having such a construction, when the film thickness of the transparent electrode 5 is 50% or less of the peak wavelength of light emitted from the light-emitting region, most of the light at the critical angle or greater is not reflected due to the same principle as above, and thus the external extraction efficiency is increased.

Embodiments 1 and 2 described the case where a reflective electrode was used; however, even when an insulating and reflective layer, which is made, for example, of a mixture of a highly light reflective substance such as $TiO_2$ or $BaTiO_3$ and a highly dielectric substance such as cyanoethyl cellulose, is provided between the substrate and the first electrode or between the first electrode and the light-emitting layer, the external extraction efficiency is increased due to the same principle.

Embodiment 3

Figure 3:
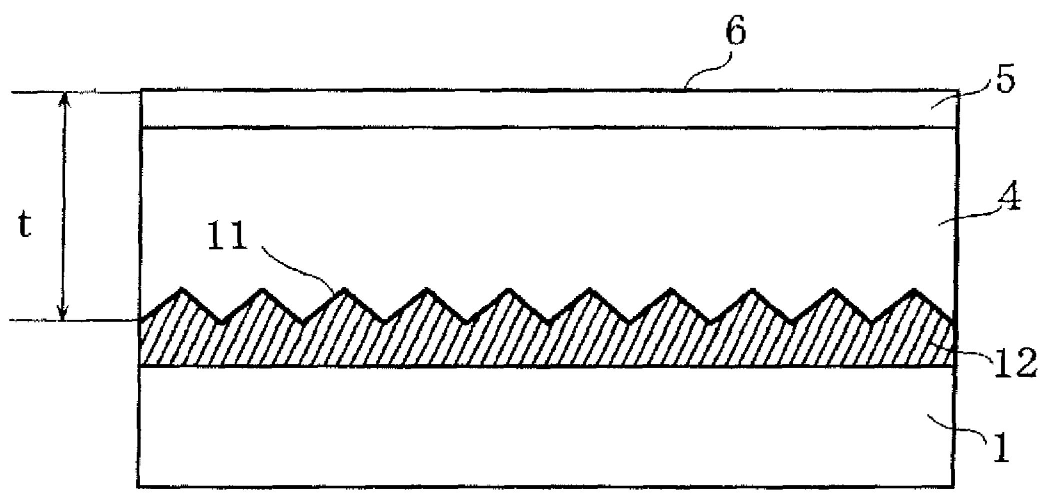
FIG. 3 is a cross-sectional view schematically showing a light-emitting element according to Embodiment 3 of the present invention.

FIG. 3 is a cross-sectional view schematically showing a light-emitting element according to Embodiment 3, which corresponds to the foregoing second aspect. The light-emitting element is constructed such that on a substrate 1 a reflective electrode 12 having a light-scattering surface (irregular surface) 11, serving as a light-scattering portion, a light-emitting layer 4 having a light-emitting region 3, and a transparent electrode 5 are stacked on top of each other in this order. The surface of the transparent electrode 5 serves as a light-extracting surface 6.

In the present embodiment, a substrate provided with light-emitting elements, comprising a substrate and a plurality of the above-described light-emitting elements disposed on the substrate, was constructed such that the relationship between the distance between a reflective layer (the reflective electrode or an insulating and reflective layer) composing the light-emitting element, and the light-extracting surface, and the longest distance between any two points in the in-plane direction (of the surface where the reflective layer is present) of the light-emitting element is specified by the critical angle or the like, so as to avoid mixing lights between adjacent light-emitting elements. A more detailed description is given below.

In the substrate provided with light-emitting elements of the present embodiment, the distance t between the reflective layer and the light-extracting surface, and the longest distance L between any two points in the in-plane direction of the light-emitting element, are determined to satisfy the following Equation (1).

$$t<(n \cos \theta/2)\times L \quad (1)$$

where θ is the critical angle for the light-extracting surface and n is the refractive index of the light-emitting region.

Figure 4:
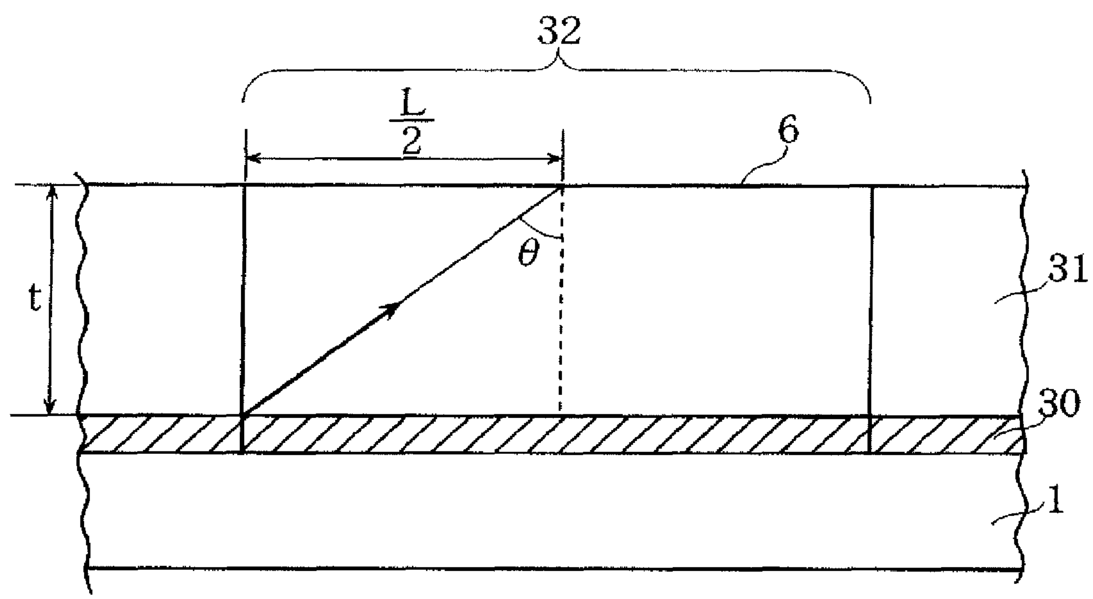
FIG. 4 is a diagram illustrating the theoretical construction of the light-emitting element according to Embodiment 3 of the present invention.

The introduction of the above equation is described below with reference to FIG. 4. It is to be noted that the drawing is simplified to describe the introduction of the equation.

In the drawing, of light emitted from a light-emitting region of a light-emitting element 32, such light as to have been reflected off a reflective layer 30 is directed toward a light-extracting surface 6. At this point, while light at less than the critical angle θ with respect to the light-extracting surface 6 is extracted outside the element, light at the critical angle θ or greater is totally reflected. In such a case, when t and L satisfy the relationship "$t<L/(2 \tan \theta)$", the totally reflected light reaches the reflective layer of the same element and thus is not directed toward a reflective layer of any adjacent light-emitting element. Here, since θ is the critical angle, the equation "$n\times\sin \theta=1$" is obtained. In addition, since $\tan \theta=\sin \theta/\cos \theta$, by combining these equations, the above Equation (1) is introduced. In FIG. 4, reference numeral 31 denotes a portion through which light emitted from the light-emitting region is transmitted. Specifically, the portion corresponds to a transparent electrode, a light-emitting layer, and the like.

When Equation (1) is satisfied, most of the light emitted within a single light-emitting element is supposed to be extracted from a light-extracting surface of the single light-emitting element. Thus, in cases where adjacent light-emitting elements emit light with different colors, the colors are not mixed, and therefore problems such as image blur can be suppressed.

In addition, according to the present embodiment, the external extraction efficiency is improved for the following reason. A prior-art element comprises, from the transparent substrate side, an anode electrode (transparent electrode)/light-emitting layer/cathode electrode (reflective electrode with a flat surface). In this element, light emitted from a light-emitting region of the light-emitting layer is extracted from the transparent substrate side after having been transmitted through the transparent electrode and the transparent substrate. At this point, light at the critical angle or greater is totally reflected at an interface (light-extracting surface) between the transparent substrate and air, or the like, and is confined within the transparent substrate, transparent electrode, or light-emitting layer. On the other hand, in an element of the present embodiment since a light-scattering surface is present, during multiple reflection between a light-extracting surface and a reflective electrode surface, the reflected light is scattered by the light-scattering surface, whereby the reflected light partly enters at an angle less than the critical angle and then is extracted straight outside the element. Consequently, the external extraction efficiency is improved.

It is desirable that the light-scattering surface 11 be capable of isotropically scattering light that is emitted from the light-emitting region. For the surface roughness of the light-scattering surface 11, in order to obtain satisfactory scattering effects, the maximum value ($R_{max}$) is desirably ¼ or more of the peak wavelength of light emitted from the light-emitting region.

The light-scattering surface 11 can be formed by heating the substrate during the formation of a reflective electrode, or by forming a reflective electrode and then heat treating the reflective electrode to induce crystal growth of the metal film, thereby forming irregularities on the surface of the film. For another method, it is also possible that after forming a reflective electrode, a surface of the reflective electrode may be mechanically roughened by sandblasting or the like. For still another method, after roughening a substrate surface by mechanical processes such as sandblasting, by physical etching processes using, for example, ion beam, or by chemical etching processes using, for example, acid or alkali, a reflective electrode may be formed so as to conform to the shape of the irregular substrate surface.

When an element has such a construction as to be described in the present embodiment, in which a reflective electrode/light-emitting layer/transparent electrode are provided from the transparent substrate side, light is extracted from the transparent electrode side, preventing light from traveling in the lateral direction during multiple reflections within the thick substrate. Accordingly, in cases where a plurality of elements, each is of the order of several hundred μm square in size, are disposed, as in a dot-matrix display, it is possible to inhibit light from being emitted from a location away from an emitted element in the lateral direction.

Embodiment 4

Figure 5:
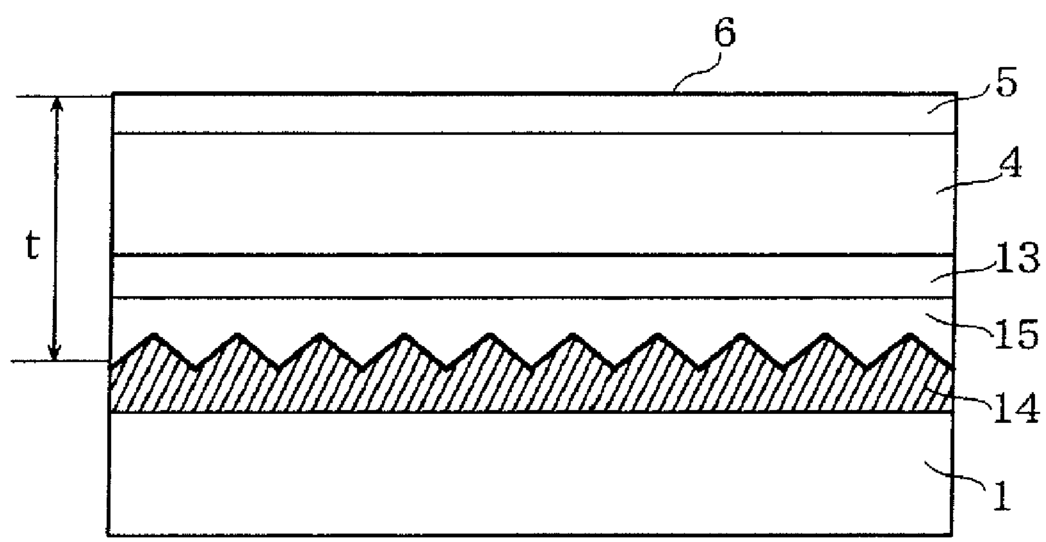
FIG. 5 is a cross-sectional view schematically showing a light-emitting element according to Embodiment 4 of the present invention.

FIG. 5 is a cross-sectional view schematically showing a light-emitting element according to Embodiment 4, which corresponds to the foregoing second aspect. This light-emitting element differs from a light-emitting element of Embodiment 3 in that a transparent electrode 13 is used in place of the reflective electrode 12, and beneath the transparent electrode (on the substrate side) there are provided a light-scattering layer 14, which has a light-scattering surface (irregular surface) serving as a light-scattering portion, and a planarizing layer 15 for planarizing the light-scattering surface.

The light-scattering layer 14 does not function as an electrode, and therefore any material, even with low electrical conductivity can be suitably used for the light-scattering layer as long as the material has high light reflectivity and is capable of isotropically scattering light emitted from a light-emitting region. This provides the advantage of a wide selection of materials. Specifically, in addition to a metal film of Al or an Al compound, silver or a silver compound, or the like, it is also possible to use a mixture of a highly light reflective substance such as $TiO_2$ or $BaTiO_3$ and a highly dielectric substance such as cyanoethyl cellulose, or the like. The light-scattering layer can be formed by a method in which after depositing a light-scattering layer using the above-described materials, the surface of the layer is roughened, for example, by mechanical processes such as sandblasting, by physical etching processes using, for example, ion beam, or by chemical etching processes using, for example, acid or alkali.

The planarizing layer 15 should be a transparent insulating film; for example, inorganic materials such as $SiO_2$ or polymer materials such as polymethyl methacrylate (PMMA) can be used. In the case of the inorganic materials such as $SiO_2$, a film can be deposited by sputtering, electron-beam evaporation, or the like. A polymer film of, for example, PMMA or the like can be deposited by coating methods such as spin coating and casting. When the planarizing layer 15 is provided, as is the case with the present embodiment, the possibility of a short circuit can be reduced as compared with an element of Embodiment 3.

As the transparent electrode 13, a transparent electrode of oxide such as ITO or tin oxide, a metal thin film with a thickness of the order of 5 nm to several tens of nm, or the like can be used, as is the case with the transparent electrode 5.

Embodiment 4 described the case where an insulating material was used for the planarizing layer; however, it is also possible to make the construction one in which the planarizing layer is formed using a conductive material such as a conductive polymer so as to use such a planarizing layer as an electrode. This construction improves external extraction efficiency by the same principle as above, and contributes to a reduction in the thickness and size of the element.

Embodiment 5

Figure 6:
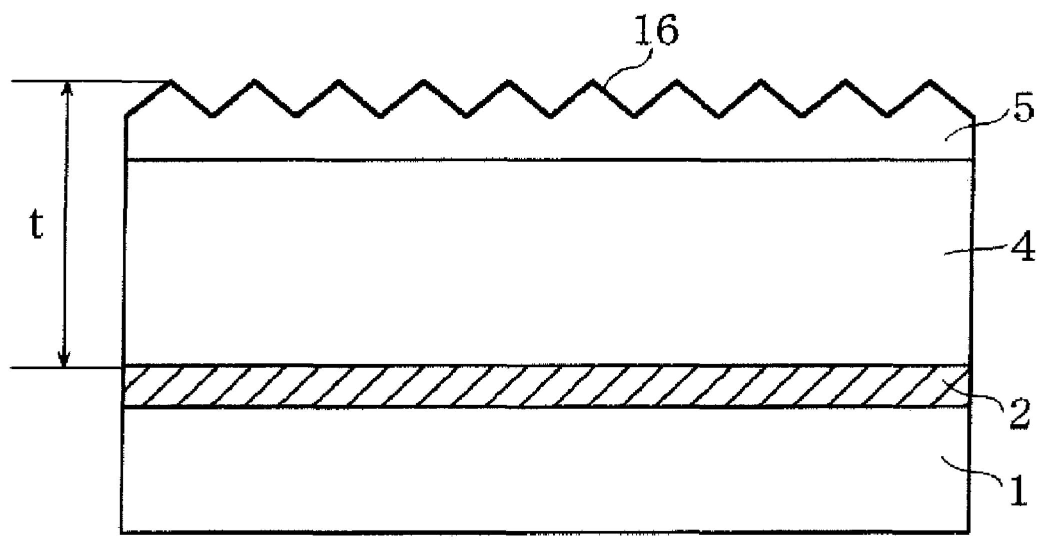
FIG. 6 is a cross-sectional view schematically showing a light-emitting element according to Embodiment 5 of the present invention.

FIG. 6 is a cross-sectional view schematically showing a light-emitting element according to Embodiment 5, which corresponds to the foregoing second aspect. This light-emitting element differs from a light-emitting element of Embodiment 3 in that the surface of a reflective electrode 12 is not made to serve as a light-scattering surface and a light-scattering surface 16 is made to serve as a light-extracting surface. By employing such a construction, the amount of light incident at angles less than the critical angle is increased, resulting in an increase in external extraction efficiency.

The light-scattering surface 16 can be formed, for example, by forming a transparent electrode 5 and then providing a surface roughening treatment to a surface of the transparent electrode by mechanical processes such as sandblasting, by physical etching processes using, for example, ion beam, or the like. It is also possible to employ a method in which a transparent material layer is formed on a transparent electrode and then etched.

Embodiment 6

Figure 7:
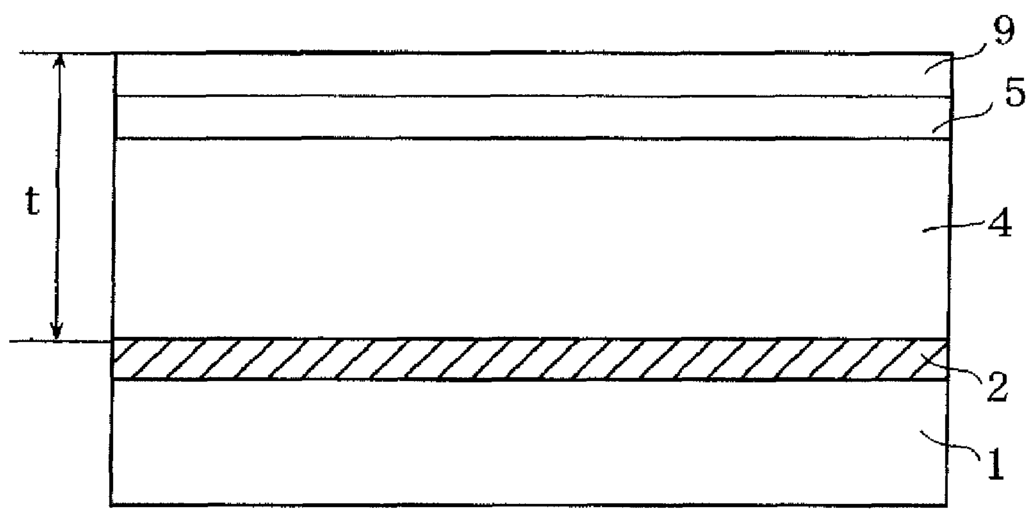
FIG. 7 is a cross-sectional view schematically showing a light-emitting element according to Embodiment 6 of the present invention.

FIG. 7 is a cross-sectional view schematically showing a light-emitting element according to Embodiment 6, which corresponds to the foregoing second aspect. This light-emitting element differs from a light-emitting element of Embodiment 3 in that the surface of a reflective electrode 2 is not made to serve as a light-scattering surface and a light-scattering layer 9 is additionally formed on the light-extracting surface side. By employing such a construction, the amount of light incident at angles less than the critical angle is increased, resulting in an increase in external extraction efficiency.

The light-scattering layer 9 is prepared by dispersing $SiO_2$ (refractive index: about 1.5) or the like in a polymer such as polymethyl methacrylate (PMMA, refractive index: about 1.7) or polycarbonate (PC, refractive index: about 1.7).

Figure 8:
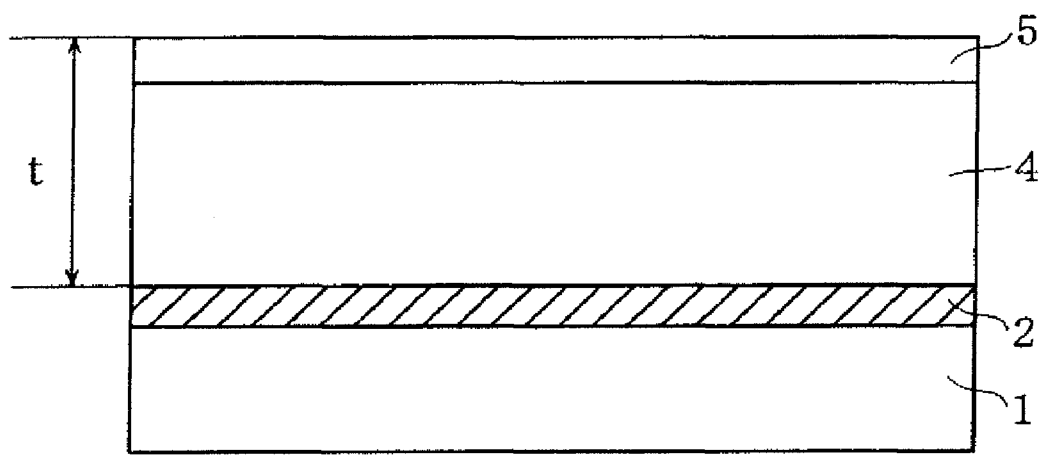
FIG. 8 is a cross-sectional view schematically showing a modified example of the light-emitting element according to Embodiment 6 of the present invention.

It is to be noted that the light-scattering layer 9 is not necessarily to be additionally formed to obtain the above function and effect; for example, it is also possible to make a structure one in which, as shown in FIG. 8, $SiO_2$ (refractive index: about 1.5) or the like is dispersed in a transparent electrode 5. Such a structure eliminates the necessity of additionally forming the light-scattering layer 9, and thus manufacturing costs can be reduced.

Embodiment 7

Figure 9:
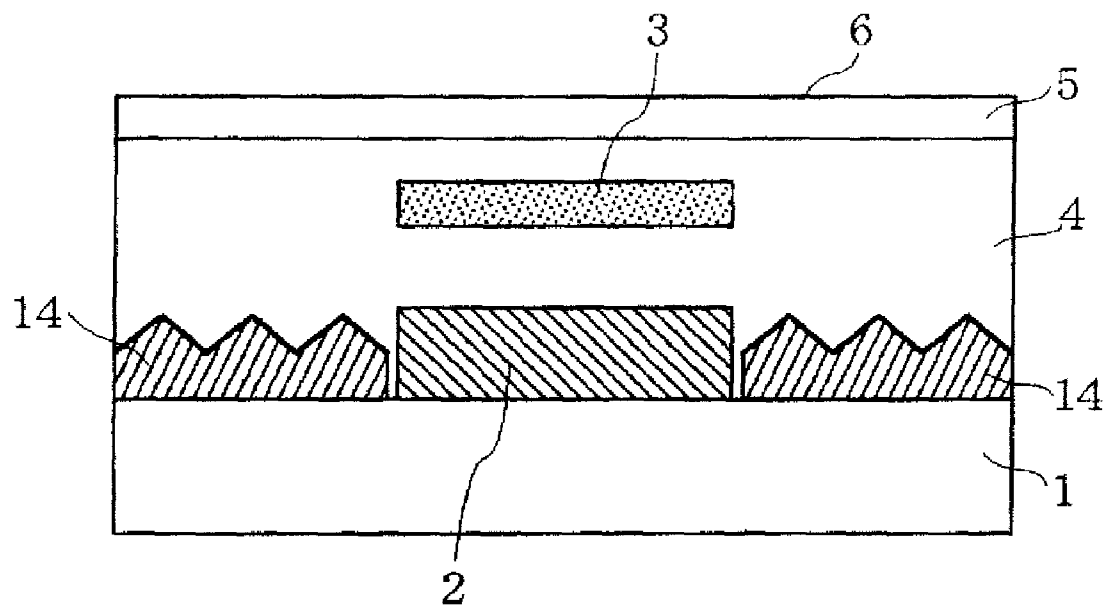
FIGS. 9(*a*) and 9(*b*) are schematic views of a light-emitting element according to Embodiment 7 of the present invention.
Figure 9:
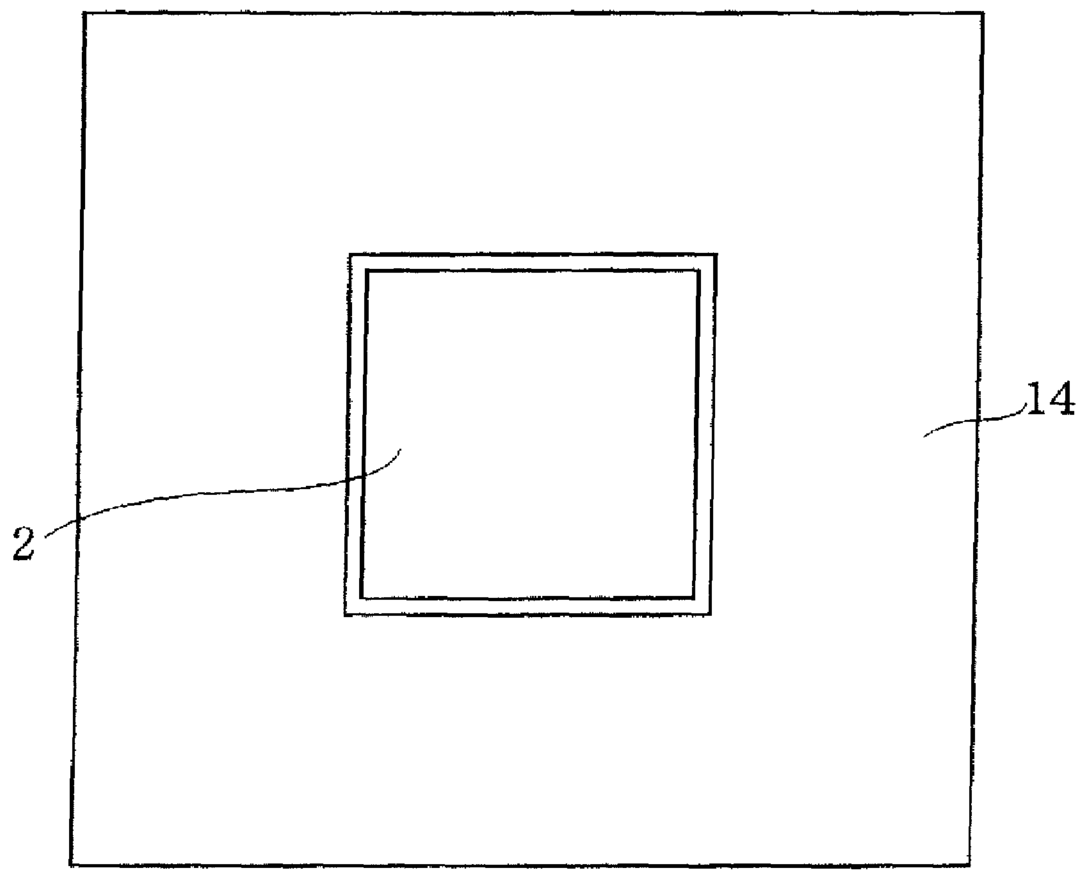

FIGS. 9(*a*) and 9(*b*) are schematic views showing a light-emitting element according to Embodiment 7, which corresponds to the foregoing third aspect. FIG. 9(*a*) is a cross-sectional view of the element, and FIG. 9(*b*) is a plan view showing the surface where a reflective electrode 2 and a light-scattering layer 14 are present. This light-emitting element differs from a light-emitting element of Embodiment 3 in that the reflective electrode (with a flat surface) 2 and the light-scattering layer (a light-scattering portion) 14 are provided in different sections on the same plane. Specifically the construction of Embodiment 3 is such that the reflective electrode is disposed on the entire surface of one side of the light-emitting layer and the entire surface of the reflective electrode is made to serve as a light-scattering surface. On the other hand, the construction of the present embodiment is such that the reflective electrode 2 is disposed on a part of one side of the light-emitting layer 4 and the light-scattering layer 14 is disposed on the other part of the one side of the light-emitting layer 4.

With the above construction, since a light-emitting region 3 is present above the reflective electrode 2 and light emitted from the light-emitting region 3 can be extracted from the entire surface of a light-extracting surface 6 by, for example, total reflection of the emitted light at the light-extracting surface and scattering of the emitted light by the light-scattering portion, it is possible to extract light more efficiently than the element of Embodiment 3. Specifically, the portion to which a voltage is applied (or the portion through which an electric current flows) during operation is a region corresponding to the area of the reflective electrode in the in-plane direction in the light-emitting layer (i.e., the light-emitting region 3). Light emitted from this region is totally reflected off the light-extracting surface, is reflected off the reflective electrode, or is scattered by the light-scattering portion. Hence, the light-extracting surface above the light-emitting region has a larger area than the area of the light-emitting region in the in-plane direction. Therefore, the entire outer surface of the light-emitting element on the transparent electrode side functions as a light-extracting surface, and light is extracted therefrom, making it possible to extract light more efficiently.

Embodiment 8

Figure 10:
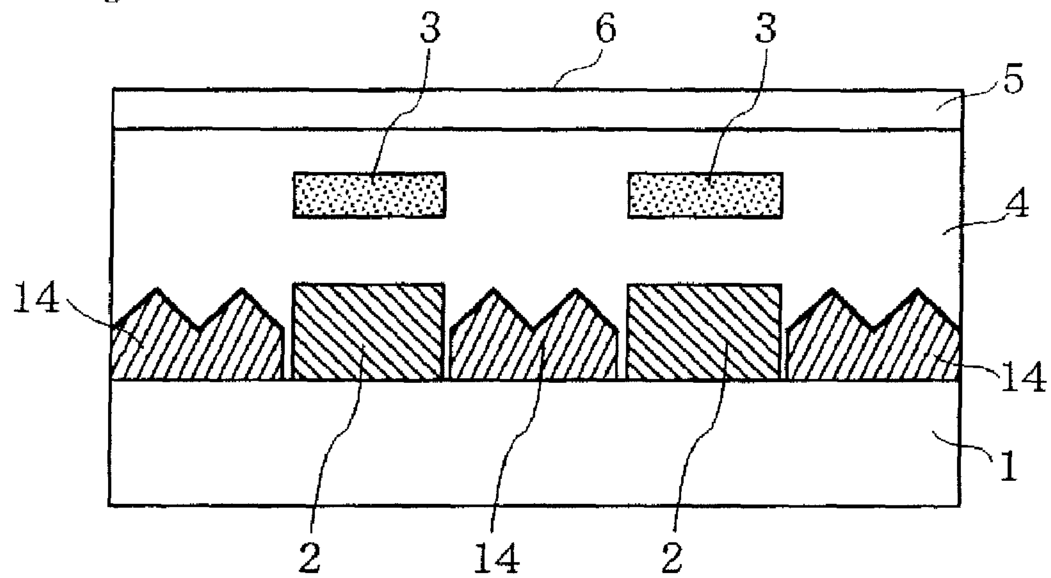
FIGS. 10(*a*) and 10(*b*) are schematic views of a light-emitting element according to Embodiment 8 of the present invention.
Figure 10:
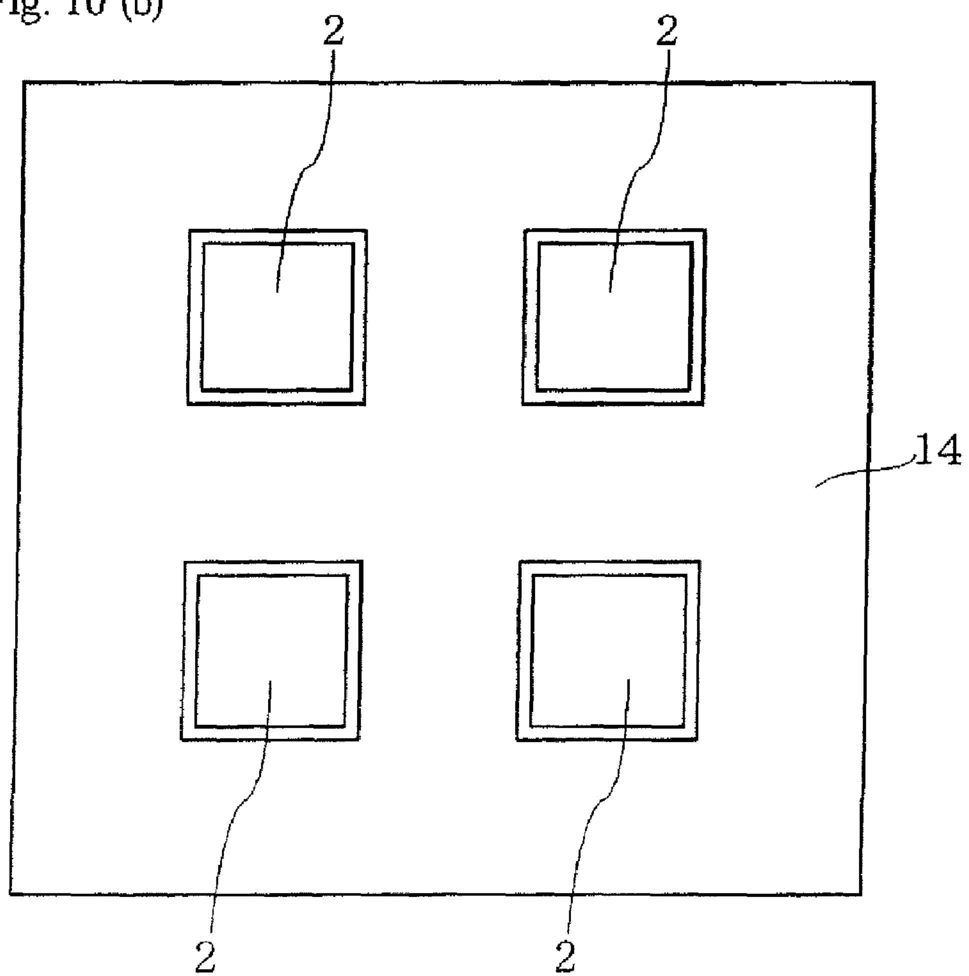

FIGS. 10(*a*) and 10(*b*) are cross-sectional views schematically showing a light-emitting element according to Embodiment 8, which corresponds to the foregoing third aspect. This light-emitting element differs from a light-emitting element of Embodiment 7 in that a plurality of (four) reflective electrodes 2 in the form of an island are present. With such a construction, since light-emitting portions of the light-emitting regions and the light-scattering portions are close to each other, it is possible to scatter light more efficiently. As a result, light can be more efficiently extracted outside the element.

Embodiment 9

Figure 11:
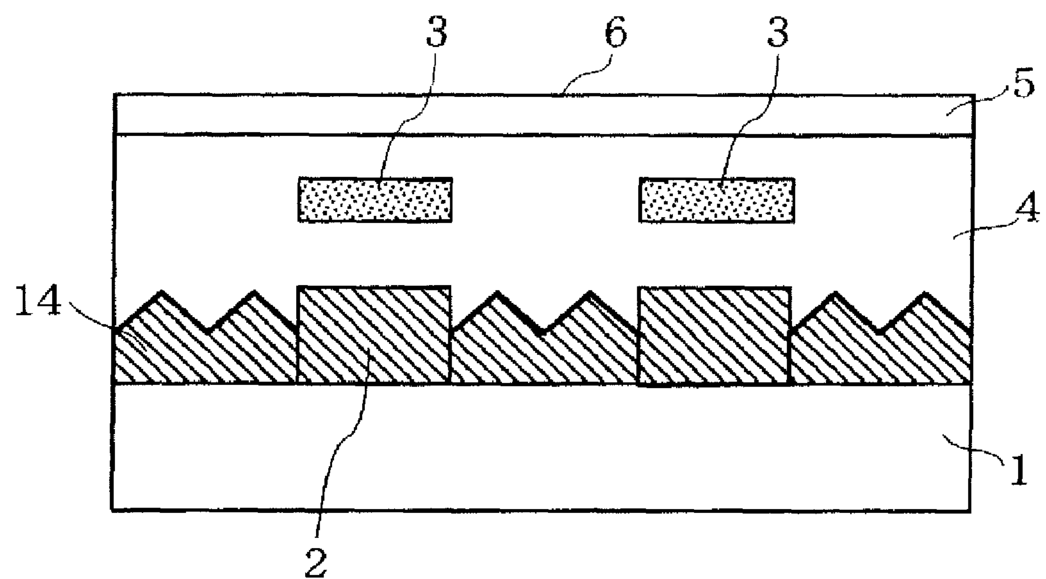
FIG. 11 is a cross-sectional view schematically showing a light-emitting element according to Embodiment 9 of the present invention.

FIG. 11 is a cross-sectional view schematically showing a light-emitting element according to Embodiment 9, which corresponds to the foregoing third aspect. This light-emitting element differs from a light-emitting element of Embodiment 8 in that a reflective electrode 2 in the form of an island also serves as a light-scattering layer 14.

Figure 12:
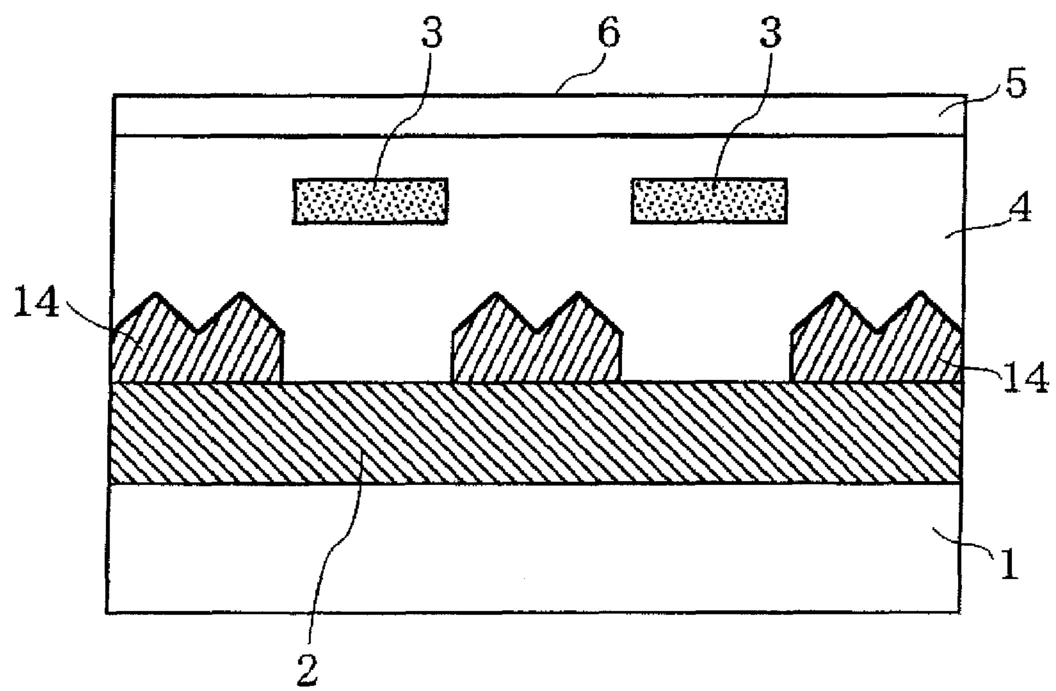
FIG. 12 is a cross-sectional view schematically showing a modified example of the light-emitting element according to Embodiment 9 of the present invention.

It is to be noted, however, that the shape is not limited to the one described above; it is also possible to form a light-scattering layer 14 on a flat reflective electrode 2, as shown in FIG. 12.

Embodiments 3 to 9 described the case where a reflective electrode was used; however, even when an insulating and reflective layer, which is made, for example, of a mixture of a highly light reflective substance such as $TiO_2$ or $BaTiO_3$ and a highly dielectric substance such as cyanoethyl cellulose, is provided between the substrate and the first electrode or between the first electrode and the light-emitting layer, the external extraction efficiency is increased by the same principle. In the case where such an insulating and reflective layer is provided, the insulating and reflective layer may be made to serve as a light-scattering portion (light-scattering surface).

Embodiment 10

The present embodiment corresponds to the foregoing fourth aspect. A light-emitting element of the present embodiment comprises an aerogel layer with a refractive index of approximately 1, and the distance between the surface of a light-emitting region facing the aerogel layer side and the surface of the aerogel layer facing the light-emitting region side, is limited to 50% or less, and preferably 30% or less, and more preferably 20% or less, and most preferably 10% or less of the peak wavelength of light. In addition, the light-emitting element has a light-scattering portion. When the construction is made to satisfy the both conditions as described above, most of the light emitted from the light-emitting region can be extracted outside the element without undergoing total reflection. Even if the light is totally reflected, because the incident angle of the light on the light-extracting surface becomes less than the critical angle due to the presence of the light-scattering portion, the light is extracted outside the element, resulting in a further improvement in external extraction efficiency as compared with prior-art light-emitting elements.

It is to be noted, however, that the aerogel layer is not essential; similar advantageous effects can be obtained even without the aerogel layer.

Embodiment 11

The present embodiment corresponds to the foregoing fifth aspect. A light-emitting element of the present embodiment comprises an aerogel layer with a refractive index of approximately 1, and the distance between the surface of the light-emitting region facing the aerogel layer side and the surface of the aerogel layer facing the light-emitting region side, is limited to 50% or less, and preferably 30% or less, and more preferably 20% or less, and most preferably 10% or less of the peak wavelength of light. In addition, the layered structure includes a reflective layer for reflecting light emitted from the light-emitting region, and a light-scattering portion is present in a part of the reflective layer. When the construction is made to satisfy the both conditions as described above, most of the light emitted from the light-emitting region can be extracted outside the element without undergoing total reflection. Even if the light is totally reflected, because the incident angle of the light on the light-extracting surface becomes less than the critical angle due to the presence of the light-scattering portion, the light is extracted outside the element, resulting in a further improvement in external extraction efficiency as compared with prior-art light-emitting elements.

It is to be noted, however, that the aerogel layer is not essential; similar advantageous effects can be obtained even without the aerogel layer.

Embodiment 12

The light-emitting elements of Embodiments 1 to 11 can be applied, for example, to display devices by arranging the light-emitting elements in a matrix so as to correspond to unit pixels. For example, after forming stripe-shaped reflective or transparent electrodes on a substrate, layers such as a light-emitting layer are deposited, and subsequently stripe-shaped transparent electrodes are formed so as to be orthogonal to the above-described electrodes. By applying any voltage to the top and bottom electrodes of an element (pixel) which you want to emit light, it is possible to make any light-emitting element (pixel) emit light at a given luminance.

Furthermore, the light-emitting elements of Embodiments 1 to 11 can be applied, for example, to lighting devices such as a backlight, by forming light-emitting elements over the entire surface of a substrate.

Embodiments 1 to 11 described the case where light was extracted from the opposite side from the substrate, but the present invention is not limited to such a construction; it is also possible to make the construction one in which, for example, a very thin film substrate is used so that light is extracted from the substrate side.

Example 1

Figure 13:
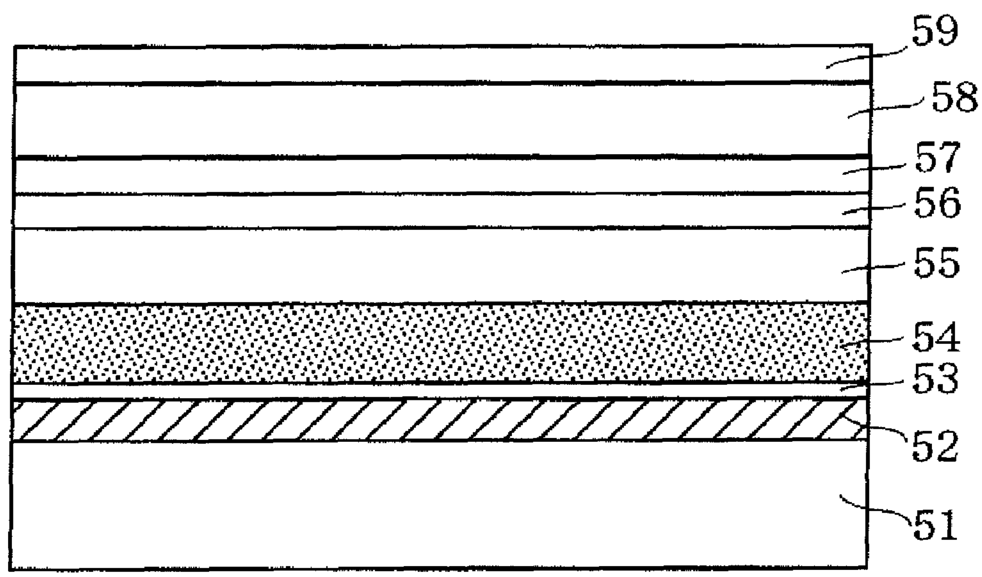
FIG. 13 is a cross-sectional view schematically showing a light-emitting element according to Example 1.

As shown in FIG. 13, a light-emitting element of Example 1 has, on a substrate 51, a reflective electrode 52, an electron-injecting layer 53, an electron transport luminescent material layer 54, a hole transport material layer 55, a buffer layer 56, a transparent electrode 57, an aerogel layer 58, and a passivation layer 59, stacked on top of each other in this order. The element was fabricated as follows.

First, a glass substrate with a thickness of 0.7 mm, serving as the substrate 51, was prepared. On the substrate, Al was vapor-deposited by sputtering to form an Al film with a thickness of about 250 nm, and then the Al film was patterned in a given configuration by photolithography to form the reflective electrode 52. Subsequently, by resistive heating evaporation, an electron-injecting layer made of Li (with a thickness of 1.5 nm), an electron transport luminescent material layer made of $Alq_3$ (with a thickness of 50 nm), a hole transport material layer made of TPD (with a thickness of 50 nm), and a buffer layer made of copper phthalocyanine (with a thickness of 5 nm) were formed. Then, a transparent electrode made of ITO (with a thickness of 220 nm) was formed by sputtering at room temperature (about 20° C.). Thereafter, an aerogel layer (with a thickness of 2 μm) was formed by coating and heating, and then a passivation layer (with a thickness of 20 μm) was formed by sputtering. Thus, a light-emitting element shown in FIG. 13 was fabricated.

Figure 25:
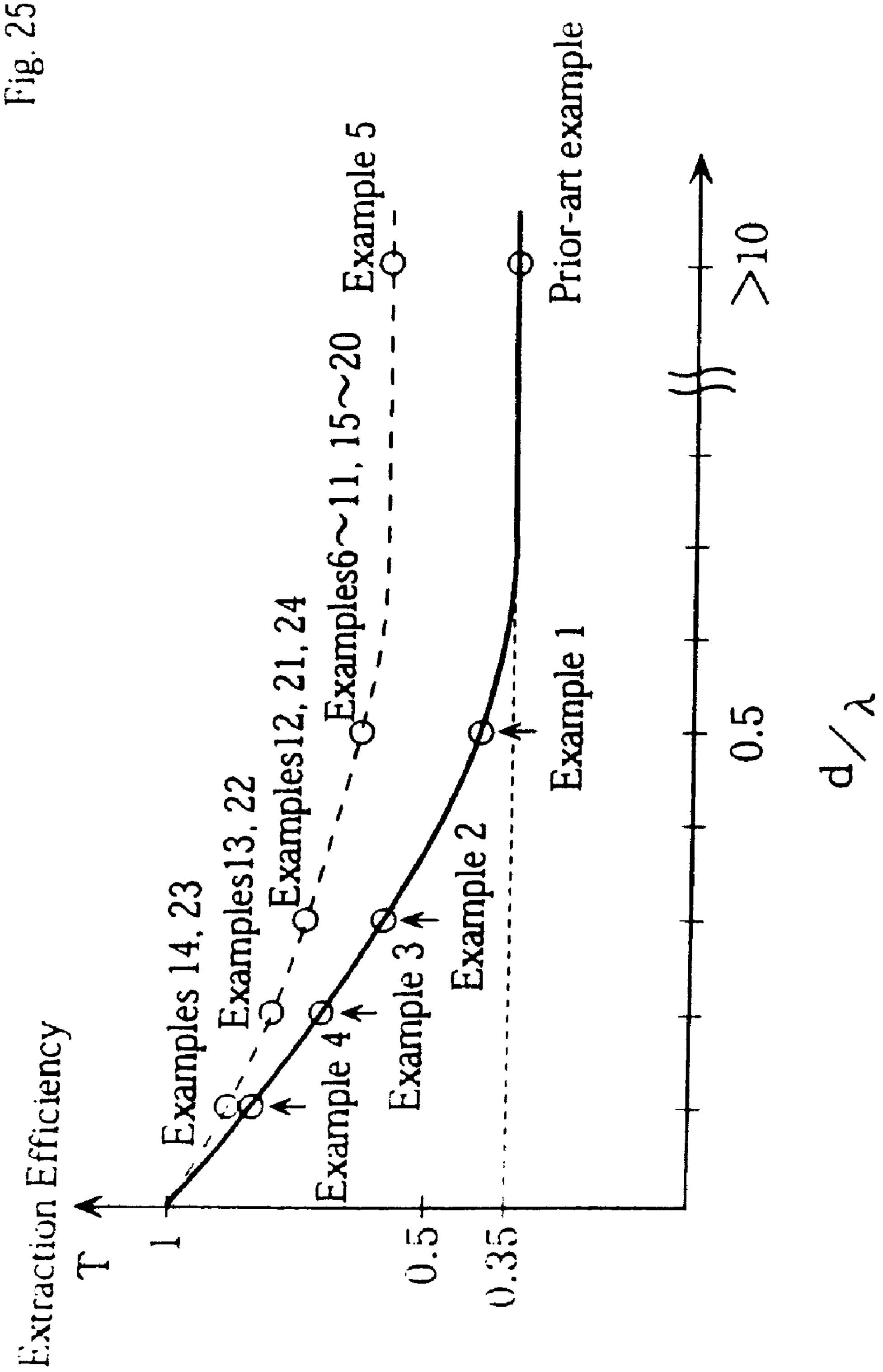
FIG. 25 is a graph showing the relationship between extraction efficiency T and $d/\lambda$.
Figure 26:
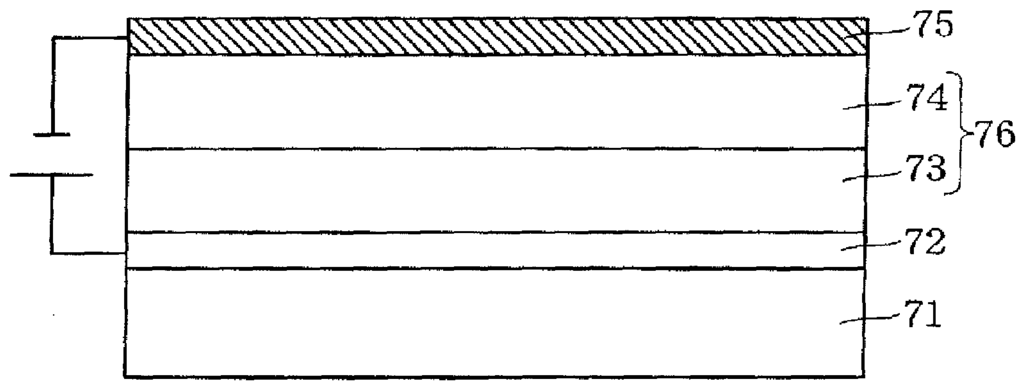
FIG. 26 is a cross-sectional view schematically showing a prior-art organic EL element.
Figure 27:
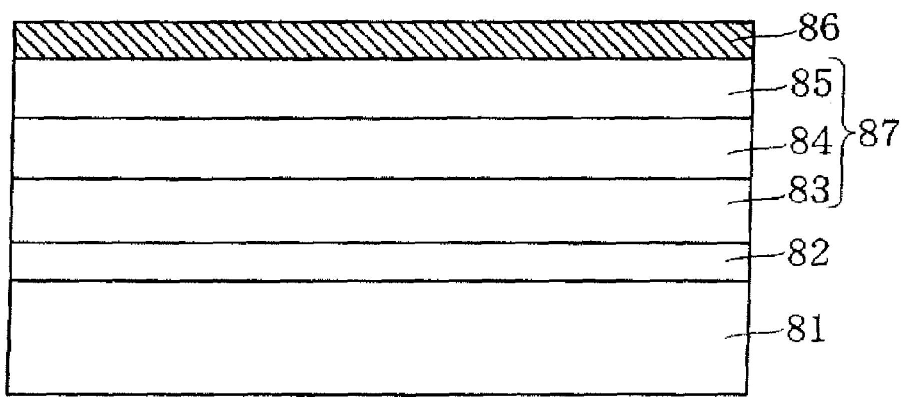
FIG. 27 is a cross-sectional view schematically showing a prior-art inorganic EL element.
Figure 28:
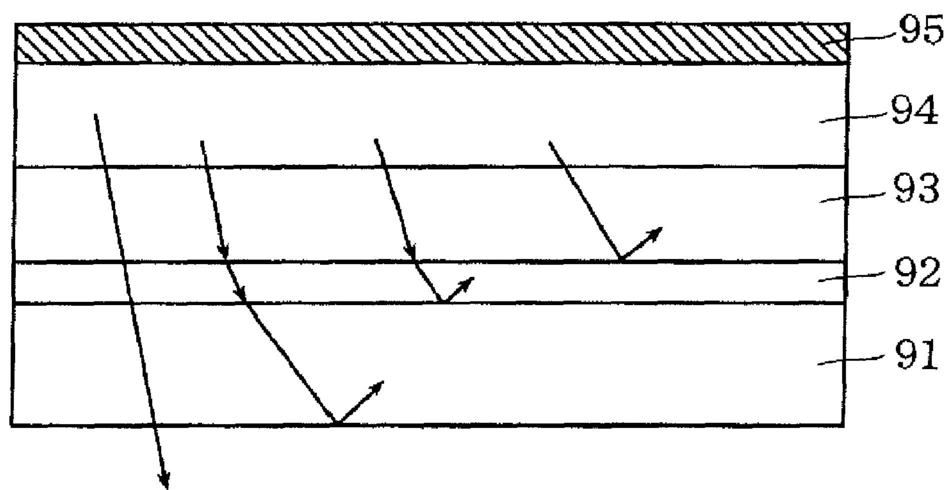
FIG. 28 is a schematic view showing extraction of light in a prior-art light-emitting element.

When a positive voltage was applied to the transparent electrode of the thus-obtained light-emitting element and a negative voltage to the reflective electrode, green light emission (peak wavelength: 550 nm) was observed from the transparent electrode side. At this time, the element obtained such a current efficiency (cd/A) as to be given in Table 1 shown below, and such an extraction efficiency T as to be shown in FIG. 25. The distance between the surface of a light-emitting region (electron transport luminescent material layer 54) facing the aerogel layer side and the surface of the aerogel layer facing the light-emitting region side was 275 nm, which was 50% of the peak wavelength of light. In FIG. 25, λ represents the peak wavelength and d represents the distance between the surface of the light-emitting region facing the aerogel layer side and the surface of the aerogel layer facing the light-emitting region side.

Example 2

A light-emitting element was fabricated in a manner similar to Example 1, except that the electron-injecting layer, electron transport luminescent material layer, hole transport material layer, buffer layer, and transparent electrode were made to thicknesses of 1.5 nm, 50 nm, 50 nm, 5 nm, and 110 nm, respectively.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 165 nm, which was 30% of the peak wavelength of light.

Example 3

A light-emitting element was fabricated in a manner similar to Example 1, except that the electron-injecting layer, electron transport luminescent material layer, hole transport material layer, buffer layer, and transparent electrode were made to thicknesses of 1.5 nm, 50 nm, 50 nm, 5 nm, and 55 nm, respectively.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 110 nm, which was 20% of the peak wavelength of light.

Example 4

A light-emitting element was fabricated in a manner similar to Example 1, except that the electron-injecting layer, electron transport luminescent material layer, hole transport material layer, buffer layer, and transparent electrode were made to thicknesses of 1.5 nm, 50 nm, 20 nm, 5 nm, and 30 nm, respectively.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 55 nm, which was 10% of the peak wavelength of light.

Example 5

Figure 14:
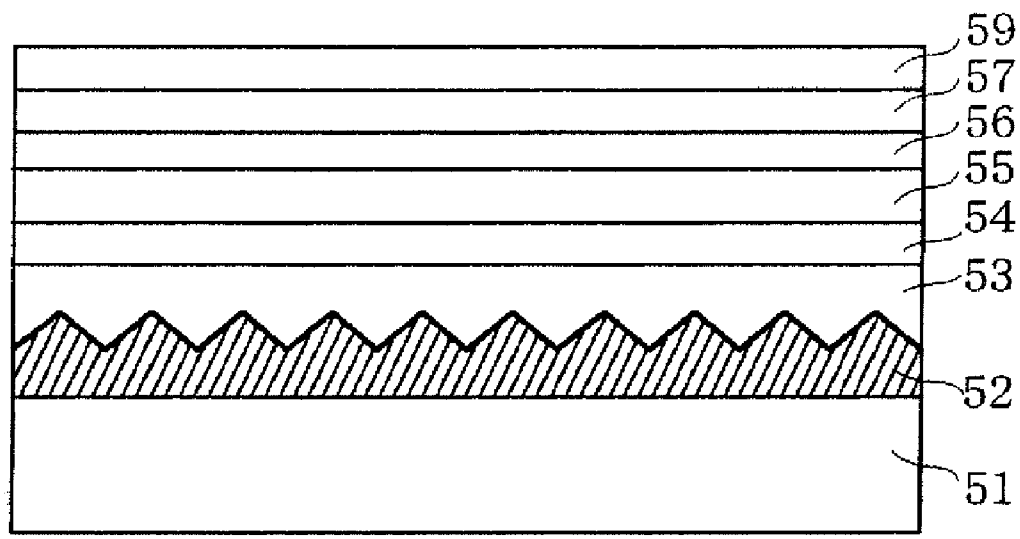
FIG. 14 is a cross-sectional view schematically showing a light-emitting element according to Example 5.

As shown in FIG. 14, a light-emitting element of Example 5 has, on a substrate 51, a reflective electrode 52 with an irregular surface, an electron-injecting layer 53, an electron transport luminescent material layer 54, a hole transport material layer 55, a buffer layer 56, a transparent electrode 57, and a passivation layer 59, stacked on top of each other in this order. The element was fabricated as follows.

First, a glass substrate with a thickness of 0.7 mm, serving as the substrate 51, was prepared. On the substrate, Al was vapor-deposited by sputtering to form an Al film with a thickness of about 250 nm, and then the Al film was patterned in a given configuration by photolithography. Thereafter, the Al film was heat-treated at 400° C., thereby forming an irregular-shaped reflective electrode with a surface roughness ($R_{max}$) of 150 nm (which was about 0.27 times the peak wavelength of light). Subsequently, by resistive heating evaporation, an electron-injecting layer made of Li (with a thickness of 1.5 nm), an electron transport luminescent material layer made of $Alq_3$ (with a thickness of 50 nm), a hole transport material layer made of TPD (with a thickness of 50 nm), and a buffer layer made of copper phthalocyanine (with a thickness of 5 nm) were formed. Then, by sputtering at room temperature, a transparent electrode made of ITO (with a thickness of 250 nm) and a passivation layer made of $SiO_2$ (with a thickness of 5500 nm) were formed. Thus, a light-emitting element shown in FIG. 14 was fabricated.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 5805 nm, which was 1000% or more of the peak wavelength of light.

Example 6

Figure 15:
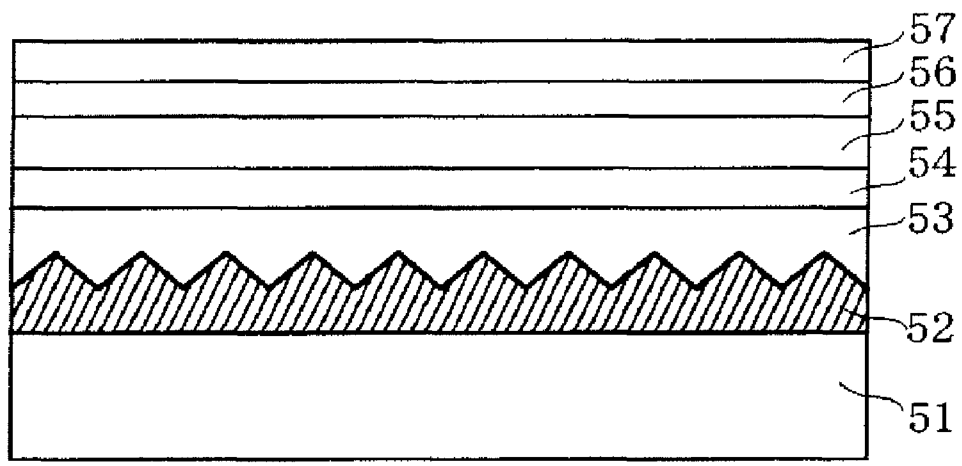
FIG. 15 is a cross-sectional view schematically showing a light-emitting element according to Example 6.

As shown in FIG. 15, a light-emitting element of Example 6 has, on a substrate 51, a reflective electrode 52 with an irregular surface, an electron-injecting layer 53, an electron transport luminescent material layer 54, a hole transport material layer 55, a buffer layer 56, and a transparent electrode 57, stacked on top of each other in this order. The element was fabricated as follows.

First, a glass substrate with a thickness of 0.7 mm, serving as the substrate 51, was prepared. On the substrate, Al was vapor-deposited by sputtering to form an Al film with a thickness of about 250 nm, and then the Al film was patterned in a given configuration by photolithography. Thereafter, the Al film was heat-treated at 400° C., thereby forming an irregular-shaped reflective electrode with a surface roughness ($R_{max}$) of 150 nm (which was about 0.27 times the peak wavelength of light). Subsequently, by resistive heating evaporation, an electron injecting layer made of Li (with a thickness of 1.5 nm), an electron transport luminescent material layer made of $Alq_3$ (with a thickness of 50 nm), a hole transport material layer made of TPD (with a thickness of 50 nm), and a buffer layer made of copper phthalocyanine (with a thickness of 5 nm) were formed. Then, a transparent electrode made of ITO (with a thickness of 220 nm) was formed by sputtering at room temperature. Thus, a light-emitting element shown in FIG. 15 was fabricated.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 275 nm, which was 50% of the peak wavelength of light. The same result regarding the distance was also obtained in Examples 7 to 11, as will be described below.

Example 7

Figure 16:
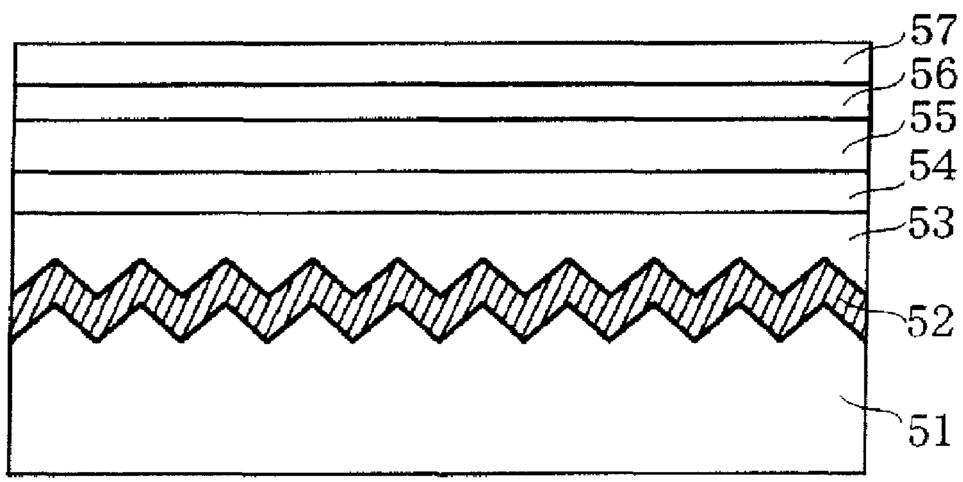
FIG. 16 is a cross-sectional view schematically showing a light-emitting element according to Example 7.

As shown in FIG. 16, a light-emitting element of Example 7 has, on a substrate 51 with an irregular surface, a reflective electrode 52 formed so as to conform to the irregular shape, an electron-injecting layer 53, an electron transport luminescent material layer 54, a hole transport material layer 55, a buffer layer 56, and a transparent electrode 57, stacked on top of each other in this order. The element was fabricated as follows.

First, a glass substrate with a thickness of 0.7 mm, serving as the substrate, was prepared, and a surface of the substrate was roughened by sandblasting. The surface roughness ($R_{max}$) of the roughened surface was 150 nm. On the substrate, Al was vapor-deposited by sputtering, and then the Al film was patterned in a given configuration by photolithography to form a reflective electrode ($R_{max}$=150 nm) with a thickness of 250 nm so as to conform to the irregular shape of the substrate surface. Subsequently, by resistive heating evaporation, an electron-injecting layer made of Li (with a thickness of 1.5 nm), an electron transport luminescent material layer made or $Alq_3$ (with a thickness of 50 nm), a hole transport material layer made of TPD (with a thickness of 50 nm), and a buffer layer made of copper phthalocyanine (with a thickness of 5 nm) were formed. Then, a transparent electrode made of ITO (with a thickness of 220 nm) was formed by sputtering at room temperature. Thus, a light-emitting element shown in FIG. 16 was fabricated.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25.

Example 8

Figure 17:
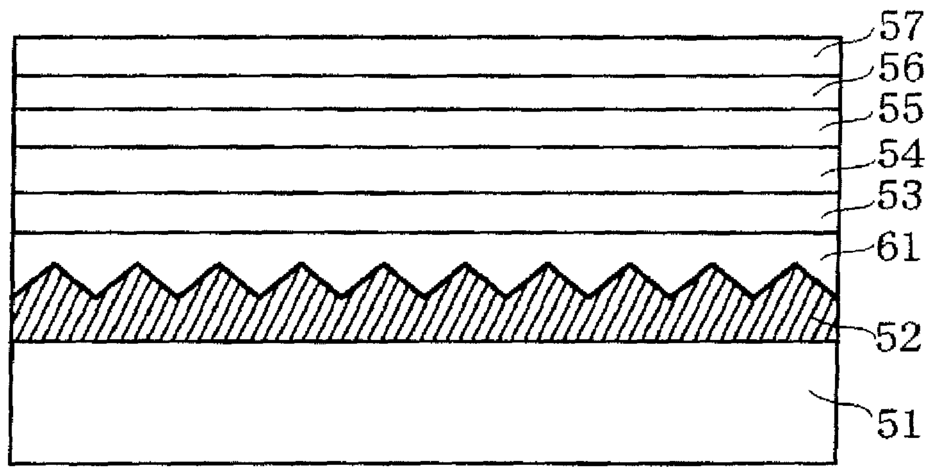
FIG. 17 is a cross-sectional view schematically showing a light-emitting element according to Example 8.

As shown in FIG. 17, a light-emitting element of Example 8 has, on a substrate 51, a reflective electrode 52 with an irregular surface, a planarizing layer 61, an electron-injecting layer 53, an electron transport luminescent material layer 54, a hole transport material layer 55, a buffer layer 56, and a transparent electrode 57, stacked on top of each other in this order. The element was fabricated as follows.

First, a glass substrate with a thickness of 0.7 mm, serving as the substrate 51, was prepared. On the substrate, Al was vapor-deposited by sputtering to form an Al film with a thickness of about 250 nm, and then the Al film was patterned in a given configuration by photolithography. Thereafter, the Al film was heat-treated at 400° C., thereby forming an irregular-shaped reflective electrode with a surface roughness ($R_{max}$) of 150 nm (which was about 0.27 times the peak wavelength of light). Subsequently, a dispersion, in which polythiophene was dispersed in water, was applied by spin coating and dried, thereby forming a planarizing layer made of a conductive polymer (with a thickness of 10 μm). Then, by resistive heating evaporation, an electron-injecting layer made of Li (with a thickness of 1.5 nm), an electron transport luminescent material layer made of $Alq_3$ (with a thickness of 50 nm), a hole transport material layer made of TPD (with a thickness of 50 nm), and a buffer layer made of copper phthalocyanine (with a thickness of 5 nm) were formed. A transparent electrode made of ITO (with a thickness of 220 nm) was formed by sputtering at room temperature. Thus, a light-emitting element shown in FIG. 17 was fabricated.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25.

Example 9

Figure 18:
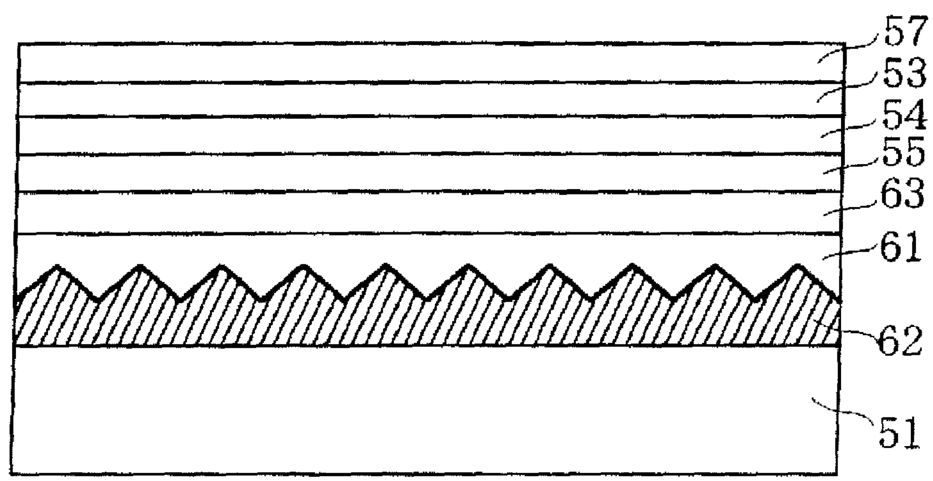
FIG. 18 is a cross-sectional view schematically showing a light-emitting element according to Example 9.

As shown in FIG. 18, a light-emitting element of Example 9 has, on a substrate 51, a light-scattering layer 62 with an irregular surface, a planarizing layer 61, a transparent electrode 63, a hole transport material layer 55, an electron transport luminescent material layer 54, an electron-injecting layer 53, and a transparent electrode 57, stacked on top of each other in this order. The element was fabricated as follows.

First, a glass substrate with a thickness of 0.7 mm, serving as the substrate, was prepared. On the substrate, AgPdCu was vapor-deposited by sputtering to form an AgPdCu film with a thickness of about 250 nm. Subsequently, $SiO_2$ was vapor-deposited by sputtering at a substrate temperature of 400° C. during vapor-deposition, thereby forming a light-scattering layer with a surface roughness ($R_{max}$) of 150 nm (which was about 0.27 times the peak wavelength of light). After the formation of the $SiO_2$ film, the $SiO_2$ film was optically ground, thereby forming a planarizing layer (with a thickness of 200 nm). On the planarizing layer, ITO was vapor-deposited by sputtering to form a transparent electrode (with a thickness of 100 nm). Thereafter, by resistive heating evaporation, a hole transport material layer made of TPD (with a thickness of 50 nm), an electron transport luminescent material layer made of $Alq_3$ (with a thickness of 50 nm), and an electron-injecting layer made of MgAg (with a thickness of 1.5 nm) were formed. The MgAg film also serves as a buffer layer. The MgAg film was formed by co-depositing Mg and Ag, and made such that Mg:Ag=10:1 ratio (by weight) by controlling their co-deposition rates. Then, ITO was vapor-deposited by sputtering to form a transparent electrode (with a thickness of 220 nm). Thus, a light-emitting element shown in FIG. 18 was fabricated.

When a positive voltage was applied to the bottom transparent electrode of the thus-obtained light-emitting element and a negative voltage to the top transparent electrode, green light emission was observed from the top transparent electrode side. At this time, the element obtained such a current efficiency (cd/A) as to be given in Table 1 shown below, and such an extraction efficiency T as to be shown in FIG. 25.

Example 10

For the planarizing layer in Example 9, polymethyl methacrylate (PMMA) was used in place of $SiO_2$. Specifically, there was prepared a solution in which PMMA was dissolved in diethylene glycol ethyl methyl ether, and the solution was applied, by spin coating, to a light-scattering layer with an irregular surface and dried, thereby forming a planarizing layer. It is to be noted that when a planarizing layer is thus formed, surface treatments such as optical grinding are not required.

When a positive voltage was applied to the bottom transparent electrode of the thus-obtained light-emitting element and a negative voltage to the top transparent electrode, green light emission was observed from the top transparent electrode side. At this time, the element obtained such a current efficiency (cd/A) as to be given in Table 1 shown below, and such an extraction efficiency T as to be shown in FIG. 25.

Example 11

Figure 19:
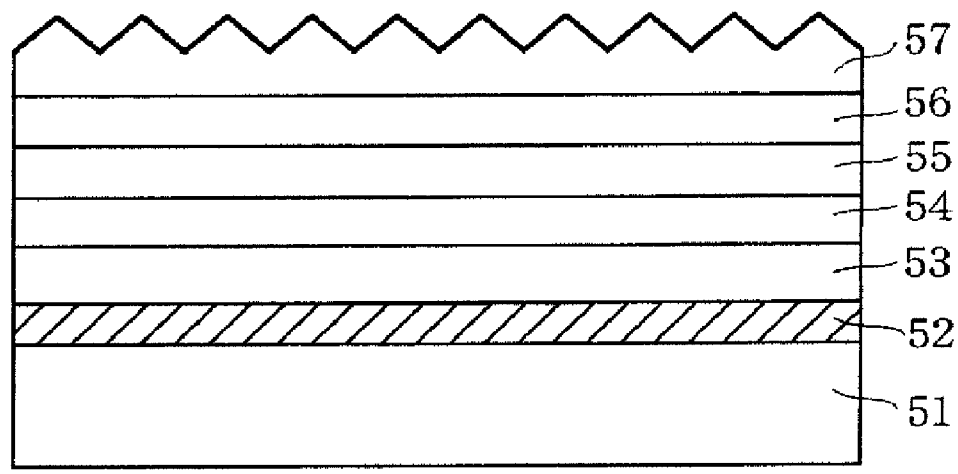
FIG. 19 is a cross-sectional view schematically showing a light-emitting element according to Example 11.

As shown in FIG. 19, a light-emitting element of Example 11 has, on a substrate 51, a reflective electrode 52, an electron-injecting layer 53, an electron transport luminescent material layer 54, a hole transport material layer 55, a buffer layer 56, and a transparent electrode 57 with an irregular surface, stacked on top of each other. The element was fabricated as follows.

First, a glass substrate with a thickness of 0.7 mm, serving as the substrate, was prepared. On the substrate, Al was vapor-deposited by sputtering to form an Al film with a thickness of about 250 nm. The Al film was then patterned in a given configuration by photolithography to form a reflective electrode. Subsequently, by resistive heating evaporation, an electron-injecting layer made of Li (with a thickness of 1.5 nm), an electron transport luminescent material layer made of $Alq_3$ (with a thickness of 50 nm), a hole transport material layer made of TPD (with a thickness of 50 nm), and a buffer layer made of copper phthalocyanine (with a thickness of 5 nm) were formed. Then, ITO was vapor-deposited by sputtering at room temperature to form an ITO film with a thickness of 220 nm. The ITO film was irradiated with an argon ion beam and etched, thereby forming a transparent electrode with an irregular surface ($R_{max}$=150 nm, which was about 0.27 times the peak wavelength of light). Thus, a light-emitting element shown in FIG. 19 was fabricated.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25.

Example 12

A light-emitting element was fabricated in a manner similar to Example 6, except that the electron-injecting layer, electron transport luminescent material layer, hole transport material layer, buffer layer, and transparent electrode were made to thicknesses of 1.5 nm, 50 nm, 50 nm, 5 nm, and 110 nm, respectively.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 165 nm, which was 30% of the peak wavelength of light.

Example 13

A light-emitting element was fabricated in a manner similar to Example 6, except that the electron-injecting layer, electron transport luminescent material layer, hole transport material layer, buffer layer, and transparent electrode were made to thicknesses of 1.5 nm, 50 nm, 50 nm, 5 nm, and 55 nm, respectively.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 110 nm, which was 20% of the peak wavelength of light.

Example 14

A light-emitting element was fabricated in a manner similar to Example 6, except that the electron-injecting layer, electron transport luminescent material layer, hole transport material layer, buffer layer, and transparent electrode were made to thicknesses of 1.5 nm, 50 nm, 20 nm, 5 nm, and 30 nm, respectively.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25. The distance between the surface of the light-emitting region facing the aerogel layer side and the surface of the aerogel layer facing the light-emitting region side was 55 nm, which was 10% of the peak wavelength of light.

Examples 15 to 23

Light-emitting elements were fabricated in a manner similar to Examples 6 to 14, except that the aerogel layer and passivation layer, similar to those used in Example 1, were provided on a transparent electrode.

When a positive voltage was applied to the transparent electrode of the thus-obtained light-emitting elements and a negative voltage to the reflective electrode, green light emission was observed from the transparent electrode side. At this time, the elements obtained such current efficiencies (cd/A) as to be given in Table 1 shown below, and such extraction efficiencies T as to be shown in FIG. 25. In the elements, the distance between the surface of the light-emitting region facing the aerogel layer side and the surface of the aerogel layer facing the light-emitting region side was the same as that obtained in each of Examples 6 to 14.

Example 24

Figure 20:
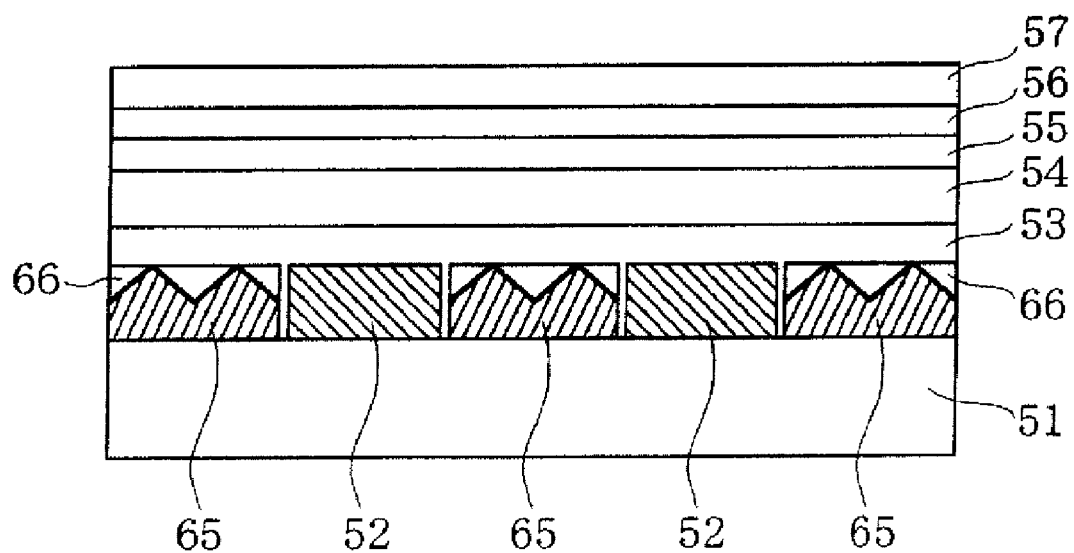
FIG. 20 is a cross-sectional view schematically showing a light-emitting element according to Example 24.

As shown in FIG. 20, a light-emitting element of Example 24 has, on a substrate 51, reflective electrodes 52, a light-scattering layer 65 with an irregular surface, and an insulating layer 66, an electron-injecting layer 53, an electron transport luminescent material layer 54, a hole transport material layer 55, a buffer layer 56, and a transparent electrode 57, stacked on top of each other. The element was fabricated in the manner shown in FIGS. 21 to 24.

Figure 21:
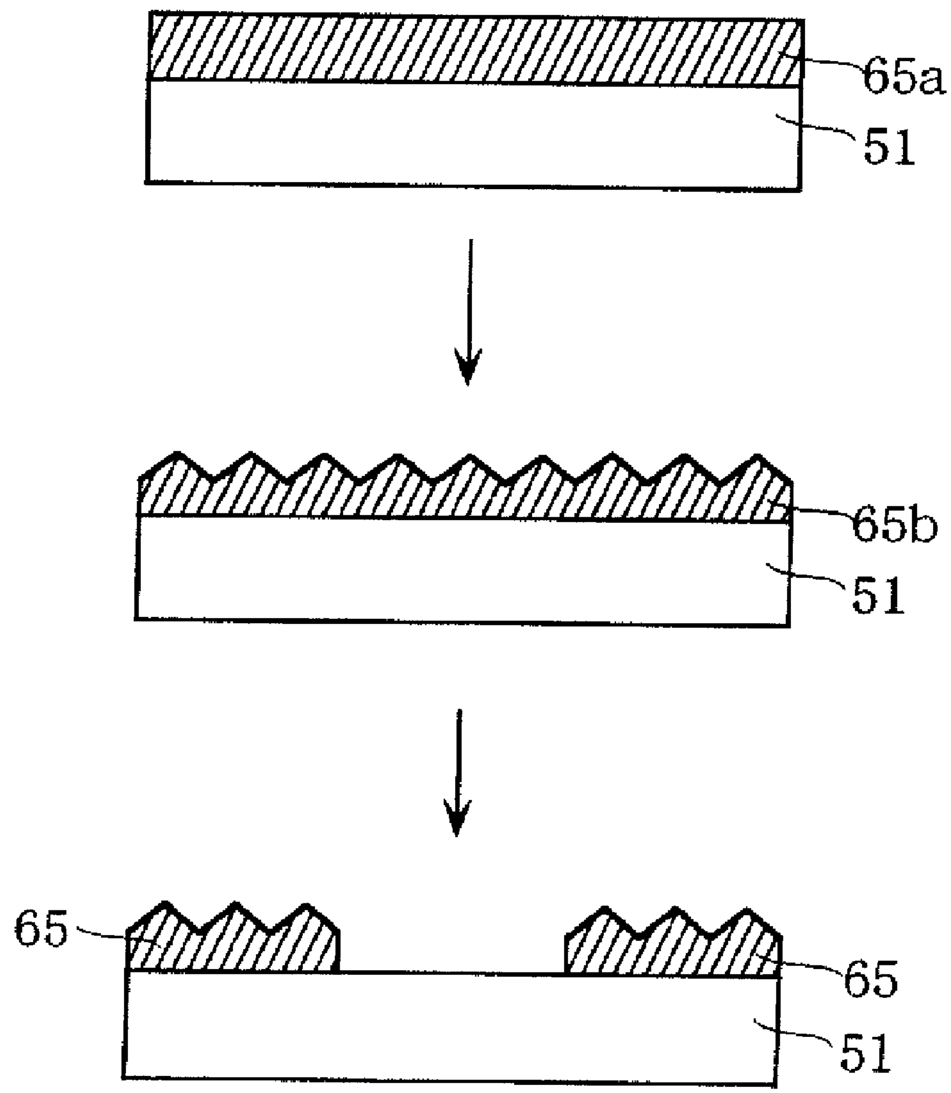
FIG. 21 is a schematic cross-sectional view of the main part of the light-emitting element according to Example 24 for illustrating the fabrication method thereof.

First, as shown in FIG. 21, a glass substrate 51 with a thickness of 0.7 mm was prepared. AgPdCu was vapor-deposited on the substrate by sputtering to form an AgPdCu film **65*a* with a thickness of 300 nm. Then, the AgPdCu film 65*a* was heat-treated at 400° C., thereby forming an AgPdCu film 65*b* with an irregular surface ($R_{max}$=150 nm, which was about 0.27 times the peak wavelength of light). Subsequently, the AgPdCu film 65*b* with an irregular surface was patterned in a given configuration by photolithography to form a light-scattering layer 65**.

Figure 22:
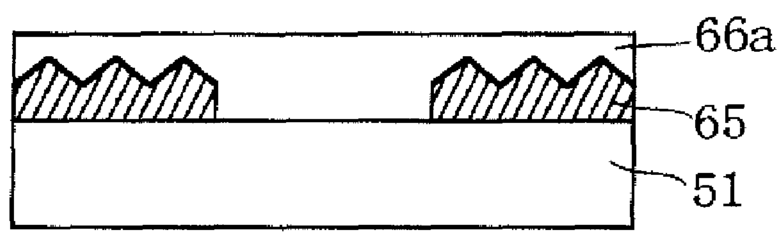
FIG. 22 is a schematic cross-sectional view of the main part of the light-emitting element according to Example 24 for illustrating the fabrication method thereof.
Figure 22:
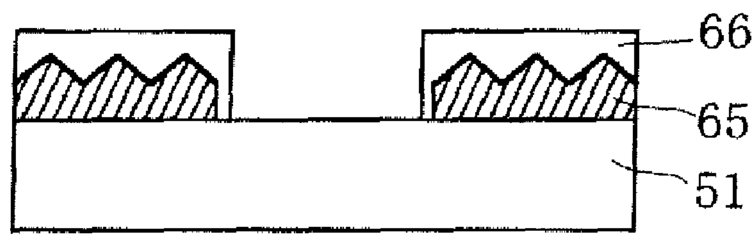

Next, as shown in FIG. 22, $SiO_2$ was vapor-deposited by sputtering so as to cover the light-scattering layer 65, thereby forming an $SiO_2$ film **66*a* with a thickness of 50 nm. The $SiO_2$ film was then patterned in a given configuration by photolithography to form an insulating layer 66**.

Figure 23:
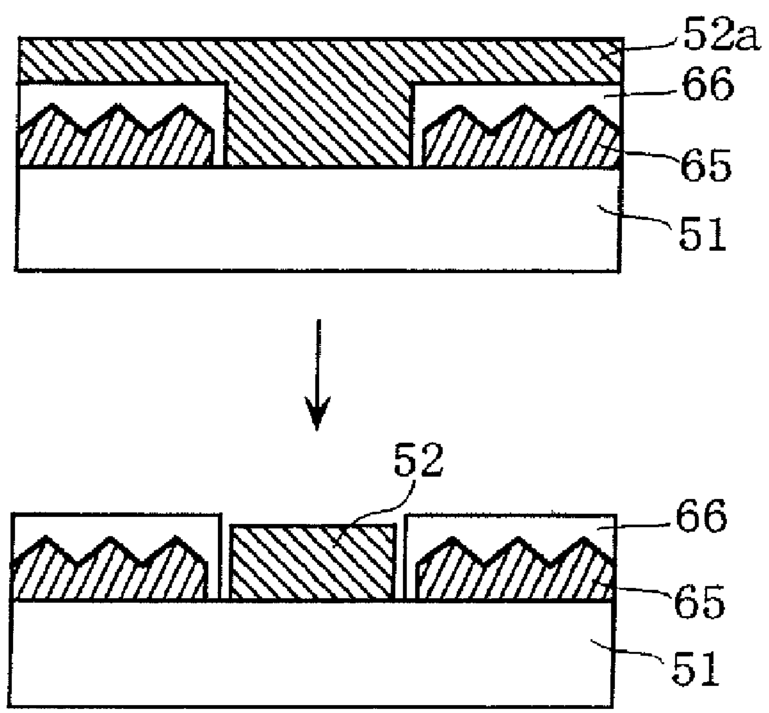
FIG. 23 is a schematic cross-sectional view of the main part of the light-emitting element according to Example 24 for illustrating the fabrication method thereof.

Then, as shown in FIG. 23, Al was vapor-deposited by sputtering to form an Al film **52*a* with a thickness of 300 nm. Thereafter, the Al film was patterned in a given configuration by photolithography to form a reflective electrode 52** in the form of an island.

Figure 24:
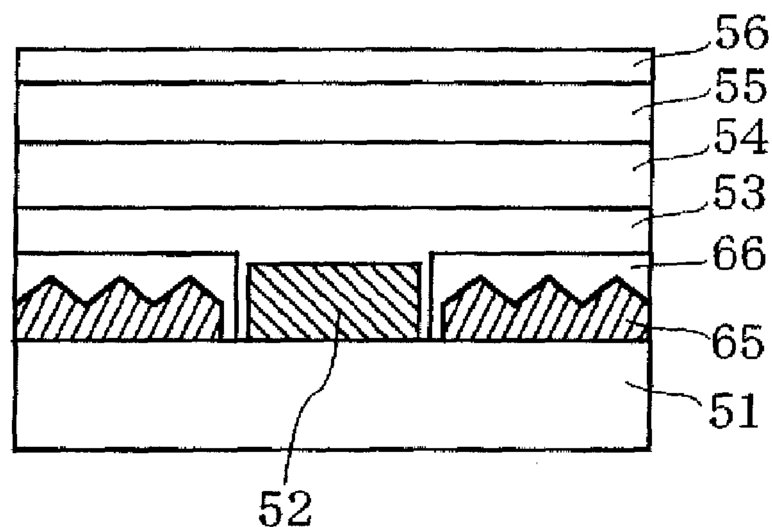
FIG. 24 is a schematic cross-sectional view of the main part of the light-emitting element according to Example 24 for illustrating the fabrication method thereof.
Figure 24:
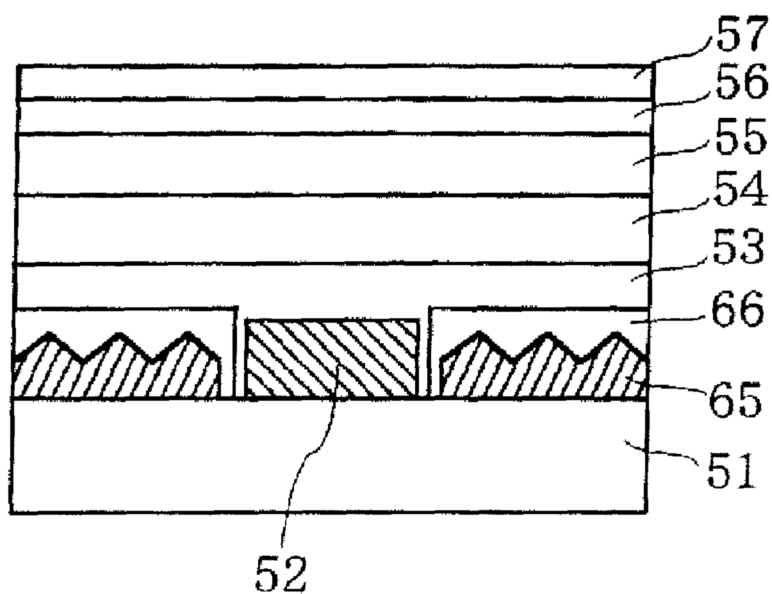

Subsequently, as shown in FIG. 24, by resistive heating evaporation, an electron-injecting layer 53 made of Li with a thickness of 1.5 nm, an electron transport luminescent material layer 54 made of $Alq_3$ with a thickness of 50 nm, a hole transport material layer 55 made of TPD with a thickness of 50 nm, and a buffer layer 56 made of copper phthalocyanine with a thickness of 5 nm were sequentially formed. Then, ITO was vapor-deposited by sputtering at room temperature to form a transparent electrode 57 with a thickness of 110 nm. Thus, a light-emitting element shown in FIG. 20 was fabricated.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25.

The distance between the surface of the light-emitting region facing the aerogel layer side and the surface of the aerogel layer facing the light-emitting region side was 165 nm, which was 30% of the peak wavelength of light.

Comparative Example 1

On a transparent substrate, a transparent electrode made of ITO, a buffer layer made of copper phthalocyanine, a hole transport material layer made of TPD, an electron transport luminescent material layer made of $Alq_3$, an electron-injecting layer made of Li, and a reflective electrode made of Al were sequentially deposited. That is, the element was such that the layers according to the construction of Example 1 were stacked upside down on top of each other on the substrate. The thicknesses of all the layers were made to be the same as those in Example 1.

When a positive voltage was applied to the transparent electrode of the thus-obtained light-emitting element and a negative voltage to the reflective electrode, green light emission was observed from the transparent electrode side. At this time, the element obtained such a current efficiency (cd/A) as to be given in Table 1 shown below, and such an extraction efficiency T as to be shown in FIG. 25.

TABLE 1

| Example | d/λ | Light-Scattering Portion | Current Efficiency (cd/A) |
|---|---|---|---|
| 1 | 0.5 | Absent | 5.0 |
| 2 | 0.3 | Absent | 7.5 |
| 3 | 0.2 | Absent | 8.2 |
| 4 | 0.1 | Absent | 10.0 |
| 5 | >10 | Present | 6.8 |
| 6-11, 15-20 | 0.5 | Present | 7.8 |
| 12, 21 | 0.3 | Present | 8.3 |
| 13, 22 | 0.2 | Present | 10.0 |
| 14, 23 | 0.1 | Present | 11.5 |
| 24 | 0.3 | Present | 9.5 |
| Comparative Example 1 | >10 | Absent | 4.0 |

From Table 1 and FIG. 25, it can be seen that the light-emitting elements of Examples 1 to 24 have higher current efficiencies and higher extraction efficiencies T than the light-emitting element of Comparative Example. In particular, when the distance between the surface of the light-emitting region facing the aerogel layer side and the surface of the aerogel layer facing the light-emitting region side is 30% or less of the peak wavelength of light (preferably 20% or less, and particularly preferably 10% or less), or when the scattering surface is present, the current efficiency and the extraction efficiency T are significantly increased.

When the distance between the surface of the light-emitting region facing the aerogel layer side and the surface of the aerogel layer facing the light-emitting region side is 10% or less of the peak wavelength of light, the extraction efficiency T can be approximated by the following Equation (2). In Equation (2), d represents the distance between the surface of the light-emitting region facing the aerogel layer side and the surface of the aerogel layer facing the light-emitting region side, and λ represents the peak wavelength of light.

$$T=1-d/\lambda \quad (2)$$

Incidentally, using glass substrates and a plurality of light-emitting elements of Example 24, there were fabricated a substrate provided with light-emitting elements that satisfied the foregoing Equation (1) and a substrate provided with light-emitting elements that did not satisfy the foregoing Equation (1). Then, a voltage was applied to only one light-emitting element of each of the substrates provided with light-emitting elements to allow the one element to emit light, and leaked light from the light-extracting surfaces of light-emitting elements adjacent to the one element was examined. It was confirmed that a rather large amount of leaked light was detected with the substrate provided with light-emitting elements that did not satisfy the foregoing Equation (1), as compared with the substrate provided with light-emitting elements that satisfied the foregoing Equation (1).

What is claimed is:

1. A light-emitting element having a layered structure, the layered structure comprising at least a light-emitting layer having a light-emitting region, the light-emitting element extracting light from a light-extracting surface distanced from the light-emitting region, the light being emitted from the light-emitting region, the light-emitting element comprising, a light-scattering portion, wherein a distance between a surface of the light-emitting region facing a side of the light-extracting surface and the light-extracting surface is limited to 50% or less of a peak wavelength of light.

2. The light-emitting element according to claim 1, wherein on a substrate, a light reflective first electrode layer, the light-emitting layer, and a transparent second electrode layer are provided in this order.

3. The light-emitting element according to claim 1, wherein on a substrate, a reflective layer, a first transparent electrode layer, the light-emitting layer, and a second transparent electrode layer are provided in this order.

4. The light-emitting element according to claim 1, wherein the distance is limited to 30% or less of the peak wavelength of light.

5. The light-emitting element according to claim 1, wherein the distance is limited to 20% or less of the peak wavelength of light.

6. The light-emitting element according to claim 1, wherein the distance is limited to 10% or less of the peak wavelength of light.

7. The light-emitting element according to claim 1, wherein the light-scattering portion corresponds to an irregular surface of a reflective layer.

8. The light-emitting element according to claim 7, further comprising a planarizing layer for planarizing the irregular surface.

9. The light-emitting element according to claim 7, wherein a maximum value ($R_{max}$) of surface roughness of the irregular surface is ¼ or more of the peak wavelength of light.

10. The light-emitting element according to claim 9, wherein the light-scattering portion is made of a base material and an additive to be dispersed in the base material, the base material and the additive having different refractive indices.

11. The light-emitting element according to claim 1, wherein the light-scattering portion corresponds to an irregular surface of the light-extracting surface.

12. The light-emitting element according to claim 8, further comprising a planarizing layer for planarizing the irregular surface.

13. A display device comprising the light-emitting element in accordance with claim 1.

14. A lighting device comprising the light-emitting element in accordance with claim 1.

* * * * *

UNITED STATES PATENT AND TRADEMARK OFFICE

CERTIFICATE OF CORRECTION

PATENT NO. : 7,741,771 B2
APPLICATION NO. : 11/969869
DATED : June 22, 2010
INVENTOR(S) : Hisanori Sugiura et al.

It is certified that error appears in the above-identified patent and that said Letters Patent is hereby corrected as shown below:

Column 28, line 46:

In the first line of claim 12, "according to claim 8" is corrected to read --according to claim 11--.

Signed and Sealed this

Ninth Day of November, 2010

David J. Kappos
*Director of the United States Patent and Trademark Office*